(12) United States Patent
Rosmeulen

(10) Patent No.: US 7,906,806 B2
(45) Date of Patent: Mar. 15, 2011

(54) MULTIPLE LAYER FLOATING GATE NON-VOLATILE MEMORY DEVICE

(75) Inventor: Maarten Rosmeulen, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/327,394

(22) Filed: Dec. 3, 2008

(65) Prior Publication Data
US 2009/0140317 A1    Jun. 4, 2009

Related U.S. Application Data

(60) Provisional application No. 60/992,010, filed on Dec. 3, 2007.

(30) Foreign Application Priority Data

May 30, 2008    (EP) .................................. 08157365

(51) Int. Cl.
H01L 29/423    (2006.01)
H01L 29/788    (2006.01)
(52) U.S. Cl. .. 257/316; 257/314; 257/315; 257/E29.129; 257/E29.3
(58) Field of Classification Search .................. 257/314, 257/315, 316, E29.129, E29.3
See application file for complete search history.

(56) References Cited

U.S. PATENT DOCUMENTS

| 5,901,084 | A * | 5/1999 | Ohnakado ................ 365/185.18 |
| 6,630,383 | B1 * | 10/2003 | Ibok et al. ..................... 438/264 |
| 7,115,942 | B2 | 10/2006 | Wang |
| 7,560,767 | B2 * | 7/2009 | Yasuda et al. ................. 257/316 |
| 2006/0128099 | A1 * | 6/2006 | Kim et al. ..................... 438/258 |
| 2006/0175654 | A1 * | 8/2006 | Pan et al. ...................... 257/315 |
| 2007/0122976 | A1 | 5/2007 | Kim |
| 2007/0132004 | A1 | 6/2007 | Yasuda et al. |
| 2007/0215924 | A1 | 9/2007 | Nishikawa et al. |
| 2007/0215929 | A1 | 9/2007 | Yasuda et al. |
| 2007/0235793 | A1 | 10/2007 | Yamazaki et al. ............. 257/314 |

FOREIGN PATENT DOCUMENTS

| JP | 09260517 | 10/1997 |
| JP | 2000-299395 | 10/2000 |

OTHER PUBLICATIONS

European Search Report, European Application No. 08170244.1 dated Feb. 5, 2009.

* cited by examiner

*Primary Examiner* — Victor Mandala
(74) *Attorney, Agent, or Firm* — McDonnell Boehnen Hulbert & Berghoff LLP

(57) ABSTRACT

The disclosed systems and methods relate to floating gate non-volatile memory cells, with a floating gate comprising at least two layers constructed in different conductive or semi-conductive materials. At least two of the layers of the floating gate are separated by an intermediate dielectric layer having a predetermined thickness enabling direct tunneling current between the layers.

13 Claims, 21 Drawing Sheets

MULTIPLE LAYER FLOATING GATE NON-VOLATILE MEMORY DEVICE

PRIORITY CLAIM

This application claims priority to U.S. provisional patent application 60/992,010 filed on Dec. 3, 2007 and European patent application EP 08157365.1 filed on May 30, 2008, both of which are incorporated by reference in their entirety.

FIELD

The disclosed systems and methods relate to floating gate non-volatile memory devices.

BACKGROUND

In prior art floating gate cells, in particular $\geq 45$ nm NAND flash memory generations, there was still sufficient space between adjacent cells to use control gates which extend into the space between the cells and hence are capacitively coupled to the floating gate via both the top wall and the side walls. The larger coupling arises from a larger area between the control gate and floating gate due to side wall of the floating gate and/or because the floating gate is extending over the active area. When a bias is applied to the control gate, the electric field in the top oxide is smaller than that in the bottom oxide. The current flowing from the floating gate to the control gate is suppressed and charge can accumulate on the floating gate. Hence, in conventional floating gate memories, the problem of programming and/or erasing saturation was not critical in view of the coupling ratio.

As a result of scaling, the conventional floating gate NAND cell evolves into a more planar structure with a thin floating gate because the space between the floating gates is disappearing and in order to reduce the capacitive interference between neighboring cells. This leads to a loss of the coupling factor, which gives rise to the problem of programming and/or erasing saturation: as a consequence of the planar structure, the current flowing from the floating gate to the control gate equals the current flowing from the substrate to the floating gate, so no charge can accumulate on the floating gate. Independent of the applied bias and the charge stored initially on the floating gate, the cell will evolve to the charge neutral state and no threshold $V_T$-window can develop in such a cell. This phenomenon is known as programming/erase saturation. As long as the top and bottom oxides are thick enough so that they operate in the FN tunneling regime, changing the thickness of the top and/or bottom oxides will not fundamentally alter the situation. So this is a real problem which is faced in sub-32 nm generations NAND flash memory which lack sidewall capacitance due to the planar structure.

Other prior art is formed by JP 2000-299395, which discloses a non-volatile memory cell having a floating gate consisting of bottom p-type layer and a top n-type layer. This stack is believed to create an electrical field such that programmed electrons are kept away from the tunnel dielectric. This way charge retention might be improved.

Other prior art is formed by US 2007/0235793 which discloses a non-volatile memory cell having a floating gate consisting of a bottom layer and a top layer, the floating gate being separated from the semiconductor substrate by an insulating layer. The materials of the bottom layer and of the substrate are selected as to reduce the barrier for injection from the substrate into the bottom layer during programming while an increased barrier is formed for tunneling of stored carriers from the floating gate back to the substrate in the idle state. To this effect, the bottom layer is formed in a semiconductor material having a bandgap smaller than the bandgap of the semiconductor substrate. Alternatively, the bottom layer can be formed in a material having an electron affinity which is larger than the electron affinity of the semiconductor substrate. Preferably the bottom layer is a Ge-compound having a bandgap smaller than the silicon substrate. The stack is said to improve the injection of carriers into the floating gate during programming and to improve the charge retention of the programmed memory cell.

SUMMARY

One problem when constructing a floating gate with multiple layers is to ensure the desired properties of the layers after full device fabrication. Therefore, one aim of the disclosed systems and methods is to provide a multiple layer floating gate non-volatile memory device in which the desired properties of the layers can be better ensured.

In the disclosed systems and methods, the aforementioned aim is achieved with the floating gate non-volatile memory device showing the technical characteristics of the first claim.

As used herein, "work function" is intended to mean the difference between the Fermi energy and the vacuum level, i.e. the minimum energy (usually measured in electron volts) needed to move an electron from the Fermi energy level into vacuum. A contact metal and a semiconductor can have different work functions, $\phi_M$ and $\phi_S$ respectively.

As used herein, "electron affinity" $\chi_S$ is intended to mean the energy difference between the vacuum level and the conduction band (CB) level, i.e. the energy required to detach an electron from a singly charged negative ion of the substrate.

A non-volatile memory device according to one embodiment comprises at least one memory cell on a substrate in a semiconductor material. Each memory cell comprises: a channel region in between two doped regions of said substrate; a floating gate above said channel region, said floating gate comprising one or more conductive or semiconductive materials; a first dielectric separating the floating gate from the substrate, said first dielectric being constructed in one or more dielectric materials and having predetermined properties enabling charge transfer by tunnelling between the channel region and the floating gate upon programming and erasing the cell; a control gate above said floating gate, said control gate being constructed in one or more conductive or semiconductive materials; and a second dielectric separating the control gate from the floating gate, said second dielectric being constructed in one or more dielectric materials and having predetermined properties for suppressing charge transfer between the floating gate and the control gate.

The floating gate comprises at least two layers in different semiconductive or conductive materials. Between at least two of these layers an intermediate layer is inserted in a dielectric material, to avoid direct physical contact. Such direct physical contact could result in mixing of the layers, e.g. a metal layer with a semiconductor layer, whereby both layers merge partly or wholly into a single layer in which the desired difference in electrical properties is no longer present or only to a lesser extent, e.g. only one work function instead of different work functions of the layers. Another example where the disclosed systems and methods are advantageous is when the layers, separated by the intermediate dielectric layer, are silicon or poly-silicon with different dopings and the doping of the layers could, in absence of the intermediate layer, intermix due to subsequent process steps with high thermal budget. In order to ensure proper operation of the floating gate, the intermediate dielectric layer has a predetermined thickness enabling direct tunneling between the layers, preferably a thickness of 0.5 to 1.5 nm.

In the memory device, a first interface of the cell is defined as the contact surface between the channel region and the first dielectric. A second interface is defined as the contact surface between the first dielectric and the floating gate. A third interface is defined as the contact surface between the floating gate and the second dielectric. A fourth interface is defined as the contact surface between the second dielectric and the control gate.

In preferred embodiments, the semiconductor material of the substrate and the materials of the floating and control gates are chosen such that during programming, the maximum electron affinity along the first interface is by a first predetermined amount smaller than the minimum work function along the third interface, and that during erasing, the maximum work function at the second interface is by a second predetermined amount smaller than the minimum work function at the fourth interface. These first and second predetermined amounts are carefully chosen such that upon programming and erasing the cell charge transfer by tunneling between the floating gate and the control gate is suppressed relative to the charge transfer by tunneling between the floating gate and the substrate.

So according to preferred embodiments, the tunneling current between the floating gate and the control gate is suppressed relative to the tunneling current between the floating gate and the substrate as a result of a predetermined choice of materials at the interfaces with the interposed dielectrics, more particularly such that the work functions at these interfaces meet predetermined requirements as described above.

In preferred embodiments, the predetermined requirements can be met by means of a floating gate which comprises at least two layers, in particular a first layer contacting the first dielectric and a second layer contacting the second dielectric. It is understood that the fact that the layers form part of the floating gate, i.e. a generally conductive region of the cell, implies that charge transfer between the layers is enabled either by a conductive connection or at least by tunneling through a thin dielectric interface.

Preferably, the materials of the first and second layers of the floating gate are in this case chosen such that the minimum work function at the third interface is larger than the maximum work function at the second interface. This additional requirement limits the choice of possible materials for the floating gate layers and can hence facilitate the achievement of the main requirements.

In preferred embodiments, the material of the first layer is n-type semiconductor material and the material of the second layer is p-type semiconductor material.

In preferred embodiments, the material of the first layer is a semiconductor material with a bandgap equal to or larger than the bandgap of the semiconductor substrate.

In preferred embodiments, the material of the first layer is a semiconductor material with an electron affinity equal to or larger than the electron affinity of the semiconductor substrate.

In preferred embodiments, the materials of the first layer and the semiconductor substrate are selected such that the barrier for injection of carriers from the first layer to the semiconductor substrate is equal to or lower than the barrier for injection of carriers from the semiconductor substrate to the first layer.

In preferred embodiments, the first layer and the substrate are constructed in the same semiconductor material.

In preferred embodiments, the material of the control gate at the fourth interface is p-type semiconductor material.

In further preferred embodiments, the tunneling current between the floating gate and the control gate can be further suppressed relative to the tunneling current between the floating gate and the substrate by acting on the coupling ratio. In these embodiments, preferably the overlap of the control and floating gates is larger than the overlap of the floating gate and the channel, and/or the third interface has a larger area than the second interface, and/or the floating gate is T-shaped.

BRIEF DESCRIPTION OF THE FIGURES

FIG. 88 left shows typical specifications for programming. FIG. 88 right shows typical specifications for erasing.

DETAILED DESCRIPTION OF THE FIGURES

Figure 1:
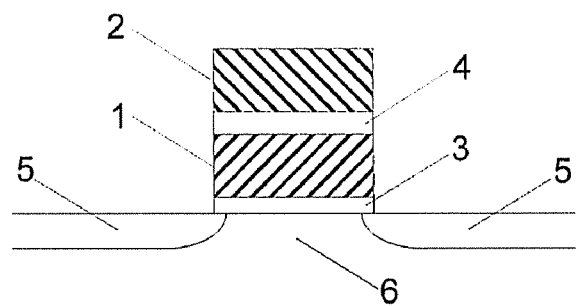
FIG. 1 shows the schematic of a typical example of a non-volatile memory cell.

Particular embodiments are described with reference to certain figures, but the invention is defined by claims and not limited to the embodiments depicted in the figures. The figures described are only schematic and are non-limiting. In the figures, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments described herein can operate in other orientations than described or illustrated herein.

The term "comprising", used in the claims, should not be interpreted as being restricted to the means listed thereafter; it does not exclude other elements or steps. It should be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

The disclosed systems and methods relate to the field of Non-Volatile-Memories (NVM). An important class of NVM cells is constructed from a Metal-Oxide-Semiconductor (MOS) Field Effect Transistor (FET) having a Floating Gate (FG). This FG is electrically isolated from other parts of the NVM circuit. One or more control gates (CG) are capacitively coupled to the FG. The presence of charge on the FG, its magnitude and/or its polarity represents the state of the memory. The amount of charge on the FG and hence the data content of the memory cell is altered by application of voltage pulses on the access nodes of the memory cell, in casu, source, drain, substrate and one or more control gates. In order to be able to set and reset the memory state repeatedly, one distinguishes the programming and erasing operations that change the amount of charge on the FG antagonistically. Depending on the type of cell, Hot Carrier Injection (HCI) and/or Fowler-Nordheim (FN) injection is used for the programming and erasing operations. The memory content of the cell is determined by application of voltage pulses on its access nodes and monitoring the drain or source current. Since the amount of charge on the FG alters the threshold voltage of the cell, the memory state of the cell can be deduced from the current response of the cell.

The schematic of a typical example of a memory cell is shown in FIG. 1. The cell has a floating gate 1 above a semiconductor substrate 6 and source and drain regions 5 placed adjacent to the substrate 6. The floating gate 1 is capacitively coupled to a control gate 2. An electrically isolating Inter Poly Dielectric (IPD) 4 is present between the floating gate 1 and the control gate 2. A tunnel dielectric (TOX) 3 is present in between the floating gate 1 and the semiconductor substrate 6. A conventional NAND memory cell employs a TOX 3 made of Silicon Dioxide of 6 to 7 nm thickness, an IPD 4 made of a Oxide-Nitride-Oxide (ONO) dielectric stack of 14 to 15 nm equivalent oxide thickness EOT, floating gate 1 made of n-type poly-Silicon of circa 100 nm thick and high doping in the order of 1e20/cm3, and a control gate 2 made of n-type poly-Silicon with high doping in the order of 1e20. The substrate (well-region) is made of crystalline Silicon with p-type doping in the order of 1 to $10e18\,cm^{-3}$. A substrate will typically have a p-type doping in the order of 1 to $10e16\,cm^{-3}$.

Figure 2:
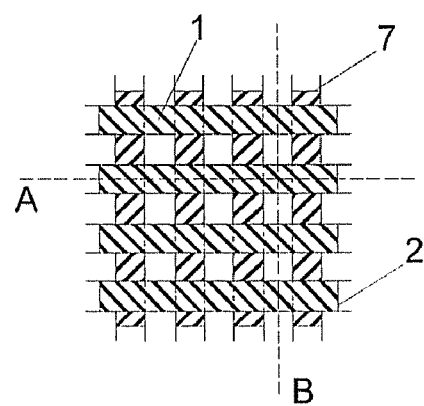
FIG. 2 shows the schematic floor plan of an excerpt of a typical non-volatile memory device comprising an array of memory cells.
Figure 3:
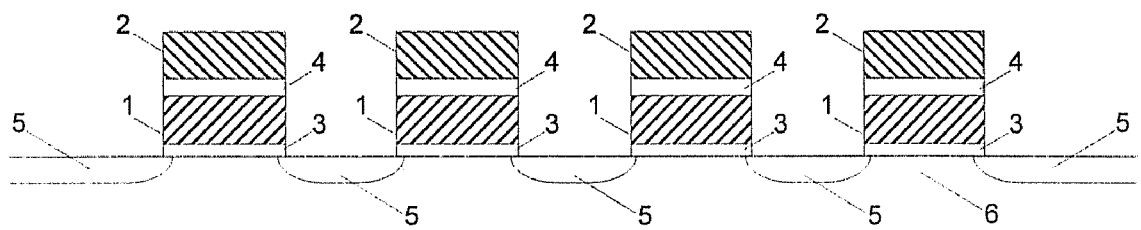
FIG. 3 shows a cross-section of a device according to FIG. 2, taken along line B.

A schematic floor plan of an excerpt of an NVM device comprising an array of memory cells is shown in FIG. 2 with a cross-section in FIG. 3. The control gates 2 of memory cells on the same row are connected to form the word line. Sources, respectively drain regions 5, in the same column are connected to form the bit line. The individual source, respective drain regions 5, can be individually contactable such that each memory cell can be individually and directly accessed (NOR-type memory) or the source, respective drain regions 5, can be linked within in each column such that all memory cells in a bit line are simultaneously biased by the bit line (NAND-type memory).

In between each column of memory cells field isolation 7 is placed to isolate the channel region in the substrate 6 from the memory cells. The floating gates 1 are located underneath the word lines 2 and in between field isolation lines 7. A cross section of the memory along line B on FIG. 2 is shown in FIG. 3. For reasons of simplicity only four cells are depicted but the number of adjacent memory cells can of course also be different than four.

Figure 4A:
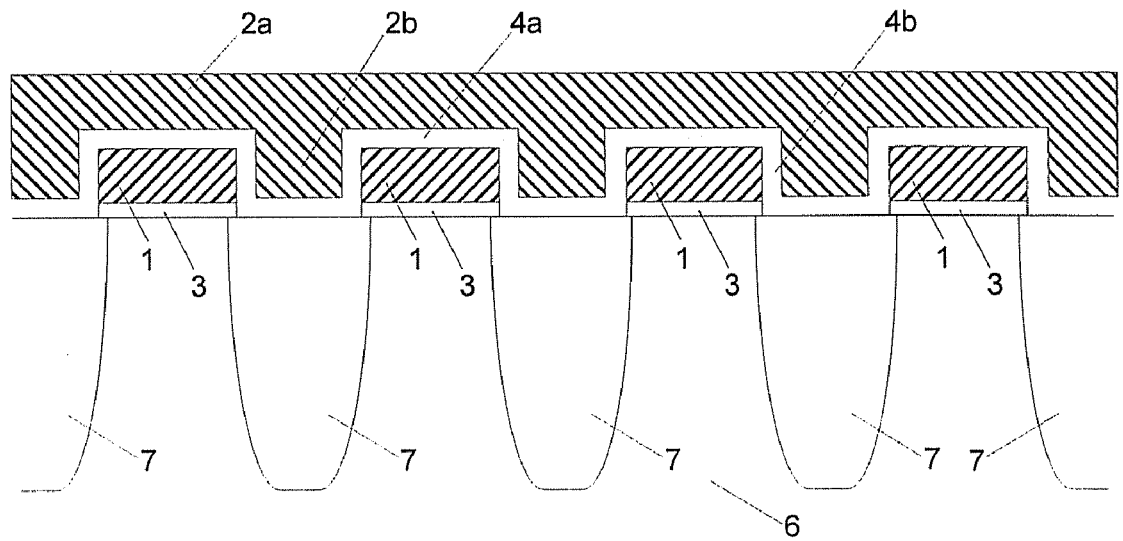
FIG. 4a shows a cross-section of a device according to FIG. 2, taken along line A.

A cross section of the memory along line A on FIG. 2 is shown in FIG. 4a. For reasons of simplicity only four cells are depicted but the number of adjacent memory cells can of course also be different than four. The word line (2a and 2b) and the IPD (4a and 4b) are made to follow the topography of the floating gates (1) so as to obtain a good capacitive coupling between the control gate (2a and 2b) and the floating gates (1). For a conventional memory cell, the coupling ratio CR is typically between 0.65 and 0.75.

The coupling ratio is defined by the ratio [1] of the capacitance between control gate and the floating gate $C_{cg}$ and the total capacitance of the floating gate $C_{tot}$.

$$CR = \frac{C_{cg}}{C_{tot}} \quad [1]$$

However, when the density of the memory cells is increased, the spacing between memory cells along the word line direction is reduced. For a floating gate spacing of circa 40 nm and smaller, there is insufficient space available to accommodate a sidewall IPD (4b) and sidewall control gate (2b). This results in a planarized memory cell architecture as shown schematically in FIG. 4b. In this planarized architecture the sidewall IPD (4b in FIG. 4a) and sidewall control gate (2b in FIG. 4a) are omitted. As a result the coupling ratio CR is reduced to 0.5 and below.

Low CR values lead to gate injection, i.e. injection of charge carries from the control gate to the floating gate or vice versa. This gate injection can lead to program and erase saturation, i.e. a small or even disappearing threshold voltage ($V_T$) window of the memory cell, and charge trapping in the IPD which may cause reliability problems, as charge in the floating gate 1 induced by the erase/program currents through the tunnel dielectric 3 between the floating gate and the channel/substrate 6 is compensated by the leakage current from the control gate 2 into that floating gate 1.

Various measures can be taken to prevent gate injection, such as for example the use of alternative IPD dielectrics such as DySco, engineered barriers such as reverse variot stack and control gate electrodes with higher work function as compared to the conventional n-type poly-Silicon. As an alternative to or in conjunction with one or more of these or other measures taken to prevent gate injection, according to preferred embodiments, the architecture of the floating gate is changed, as will first be described by some illustrative embodiments and further on be explained in general.

ILLUSTRATIVE EMBODIMENTS

Conventionally, the floating gate is constructed from a uniform piece of material, typically highly doped n-type poly-Silicon. In preferred embodiments, for example two different types of material are used for the construction of the floating gate: a material 1a with high work function is placed adjacent the IPD 4, whereas the second material 1b with a lower workfunction than 1a is placed adjacent to the tunnel dielectric 2 (TOX).

Figure 5:
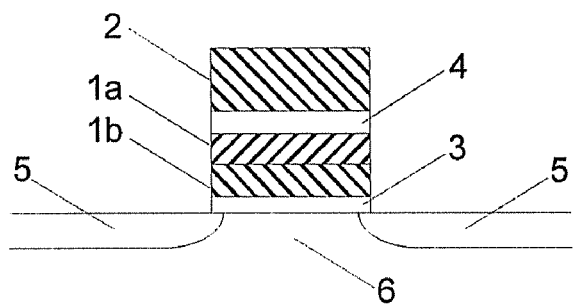
FIGS. 5 and 6 show schematic cross-sections in the orthogonal directions A/B of FIG. 2 of a memory cell with a dual layer floating gate according to preferred embodiments.
Figure 6:
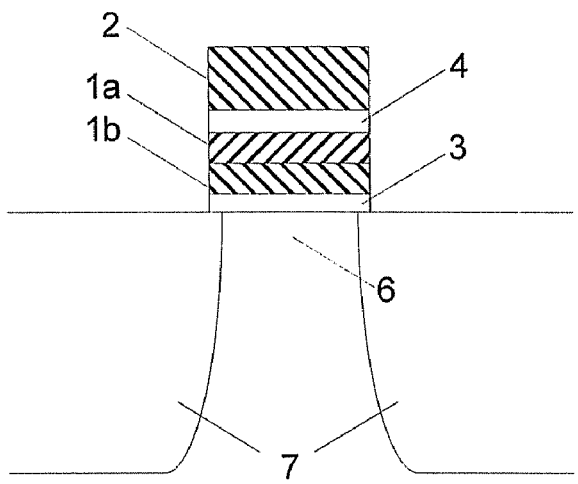

FIGS. 5 and 6 show schematic cross-sections in the orthogonal directions A/B of FIG. 2 of a memory cell with such a dual layer floating gate. The cell has a control gate 2, IPD 4, TOX 3, substrate 6, field isolation 7 and source and drain regions 5 similar to a conventional memory cell. The floating gate 1, however, comprises a first layer with high workfunction 1a adjacent to the IPD (4) and a second layer with low work function 1b adjacent to the TOX 3. The two regions 1a and 1b are in electrical contact with each other. The purpose of this contact is to electrically contact the two layers so as to avoid an appreciable bias difference to build up between the two layers during operation of the device.

Figure 7:
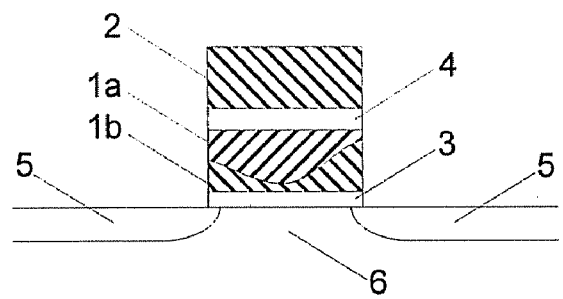
FIG. 7 shows a schematic cross-section in the orthogonal directions B of FIG. 2 of a memory cell with a dual layer floating gate according to preferred embodiments, with a varying thickness of the layers along the channel length direction.
Figure 8:
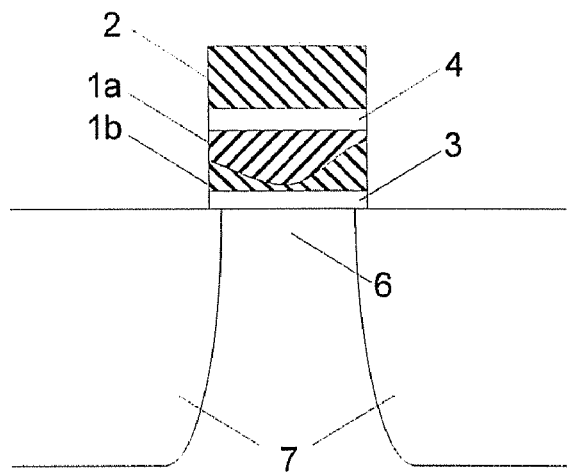
FIG. 8 shows a schematic cross-section in the orthogonal directions A of FIG. 2 of a memory cell with a dual layer floating gate according to preferred embodiments, with a varying thickness of the layers along the channel width direction.

The two layers in the floating gate can be of constant thickness along their contact area. The thickness of one or both regions can also vary along their contact area. FIG. 7 shows a schematic cross section of a cell that has both layers 1a, 1b with varying thickness along the channel length direction. FIG. 8 shows a schematic cross section of a cell that has both layers 1a, 1b with varying thickness along the channel width direction.

Figure 4B:
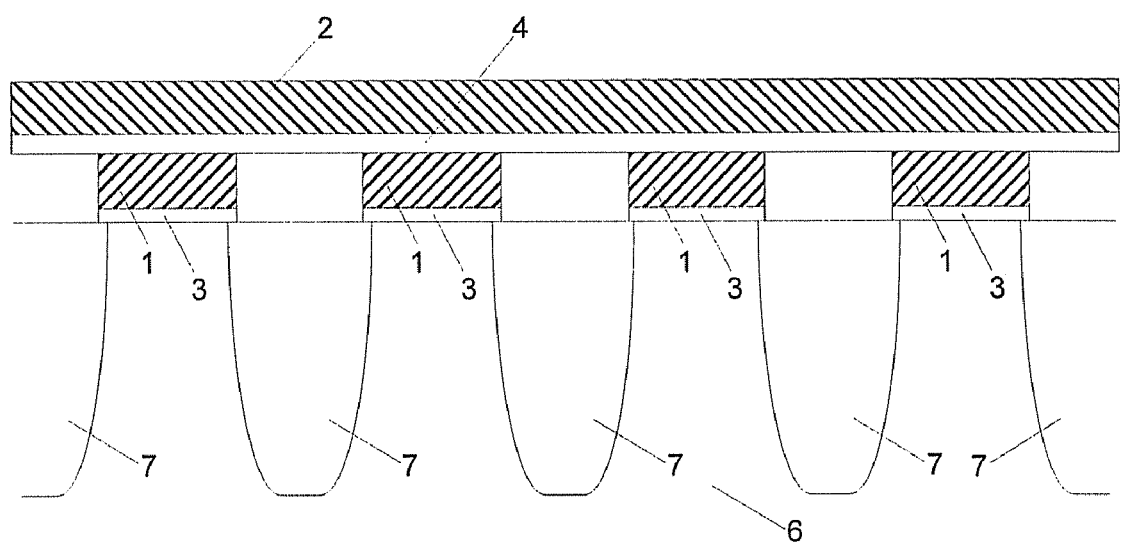
FIG. 4b shows a cross-section of another device according to FIG. 2, taken along line A.

In the following, variations in both length and width direction will be assumed unless stated otherwise. Such variations of the layer thickness in length and/or width directions can be due to process variations or certain process conditions. If, for example, the layer 1a is formed by a silicidation of a semiconductor layer, then the thickness of the resulting silicide layer 1b will be less near the edges and larger in the centre of the floating gate. Extension of the control gate across adjacent memory cells, as shown in FIG. 4b, in the case of FIG. 6, is not shown for reasons of simplicity.

Figure 9:
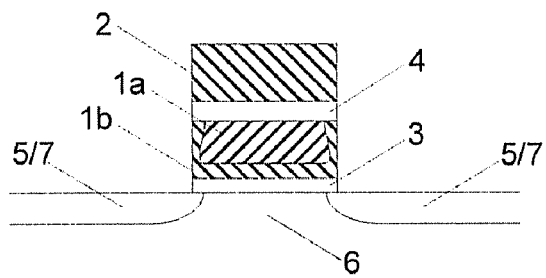
FIG. 9 shows a schematic cross-section of another memory cell with a dual layer floating gate according to preferred embodiments, with the bottom layer encompassing the top layer.
Figure 10:
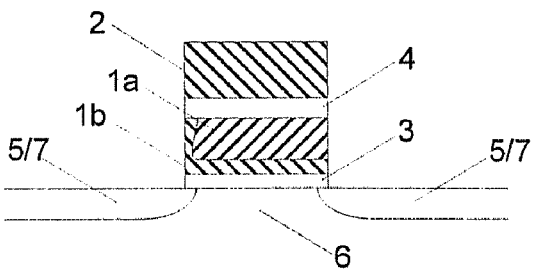
FIG. 10 shows a schematic cross-section of another memory cell with a dual layer floating gate according to preferred embodiments, with the bottom layer covering the top layer at one side.

The floating gate 1 can also comprise layers 1a, 1b, whereby the cross-section of a layer is not rectangular, but one layer can embrace the other. In the alternative embodiment of FIGS. 9 and 10, part of the bottom region 1b is adjacent to the IPD 4. First, layer 1b is deposited over the sidewalls and the bottom of a trench, then the trench is filled with layer 1a and planarized. The embodiment of FIG. 10 can be considered as a part of that of FIG. 9, e.g. by splitting the device of FIG. 9 in two halves, e.g. by using spacer-defined FET processing.

Figure 11:
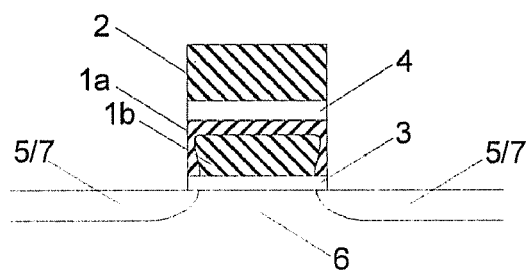
FIG. 11 shows a schematic cross-section of another memory cell with a dual layer floating gate according to preferred embodiments, with the top layer encompassing the bottom layer.
Figure 12:
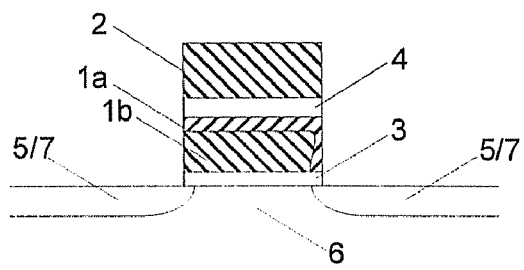
FIG. 12 shows a schematic cross-section of another memory cell with a dual layer floating gate according to preferred embodiments, with the top layer covering the bottom layer at one side.

Alternatively, part of the top layer 1a can be adjacent to the TOX 3 as shown in FIG. 11, along both sidewalls of the bottom layer 1b, or as shown in FIG. 12, along one sidewall of the bottom layer 1b. These parts of the top layer 1a preferably do not overlap the channel region 6 as then an interface with the tunnel dielectric 3 is obtained with more than one work function. As will be described below, the manufacturing of such a device can require less process steps than a device whereby two layers are stacked on top of each-other.

FIG. 11 is an implantation form of two sides or isotropic doping (plasma doping, gas phase doping): a single layer is deposited which is locally converted to the opposite type. FIG. 12 shows the doping resulting from an implantation under a given angle.

The floating gate in the disclosed devices are not limited to a combination of two layers 1a, 1b but can comprise additional layers in between the first layer 1a and the second layer 1b. This additional layer 1c can be conductive or a combination of conductive/non-conductive regions, but preferably comprises a thin dielectric layer such as for example 0.5 to 1.5 nm thick oxide between layers 1a and 1b, i.e. a thickness which enables direct tunneling current between the layers.

This intermediate layer 1c can be intentionally inserted. Such an intermediate layer can be inserted to prevent direct physical contact between the top layer 1a and the bottom layer 1b. Such direct physical contact might result in mixing both layers, e.g. a metal top layer with a semiconductor layer, whereby both layers 1a, 1b merge into a single layer with only one work function. Another prominent example is when both layers are silicon or poly-silicon and the doping of the layers 1a and 1b intermixes due to subsequent process steps with high thermal budget.

An additional intermediate layer can also result from further processing of the device. Such direct physical contact might result in mixing both layers, e.g. a metal top layer with a semiconductor layer, whereby alloys are formed at the interface with different metal/semiconductor ratio or having different crystal phases. This is not a problem as long as at the interfaces with the interpoly dielectric 4 and with the tunnel dielectric 3 a layer of a material with a predetermined work function is obtained.

Figure 13:
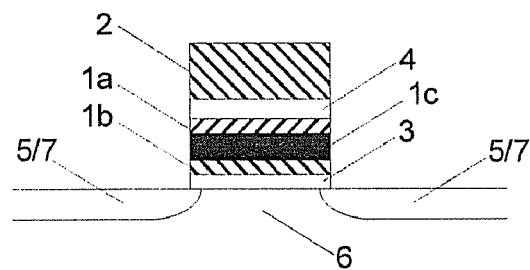
FIG. 13 shows a schematic cross-section of another memory cell with a multiple layer floating gate according to preferred embodiments, with an intermediate conductive layer between the top and bottom layers.
Figure 14:
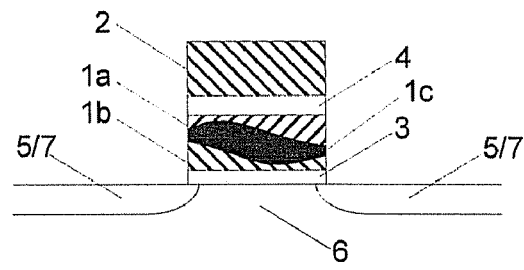
FIG. 14 shows a schematic cross-section of another memory cell with a multiple layer floating gate according to preferred embodiments, with an intermediate conductive layer of variable thickness between the top and bottom layers.

An alternative implementation is shown in FIGS. 13 and 14, where an intermediate conductive layer(s) 1c is present between the top 1a and bottom 1b layer of the floating gate 1.

FIG. 13 shows an embodiment where all layers 1a, 1b and 1c have the same thickness, similar to the embodiment illustrated by FIG. 5.

FIG. 14 shows an embodiment where the layers 1a, 1b and 1c have thicknesses that vary along the area of the cell, similar to the embodiment illustrated by FIG. 7.

This conductive layer 1c can consist of a uniform material. This conductive layer 1c can also comprise different regions, each region composed of a different conductive material. The composition of this conductive layer can be uniform along the cell area or can vary in a continuous way along the width or the length of the memory cell. The composition can vary in a discontinuous way as the conductive layer 1c is composed of adjacent conductive regions composed of different materials.

It can also contain regions, or be composed entirely of such region, that have a continuous change of material type across the volume of the region. The conductive region 1c can also be present in between the top 1a and bottom 1b regions of the floating gate in the cases described in FIGS. 9 to 11, i.e. where part of the bottom region 1b is adjacent to the IPD 4 or where part of the top region 1a is adjacent to the TOX 3.

FIGS. 13 and 14 show cases where the conductive region 1c is placed in between the top 1a and bottom 1b floating gate layers across the entire area of the cell.

Figure 15:
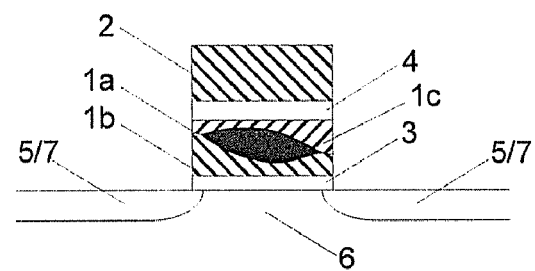
FIGS. 15-18 show schematic cross-sections of other memory cells with multiple layer floating gates according to preferred embodiments, with intermediate conductive regions locally between the top and bottom layers.
Figure 16:
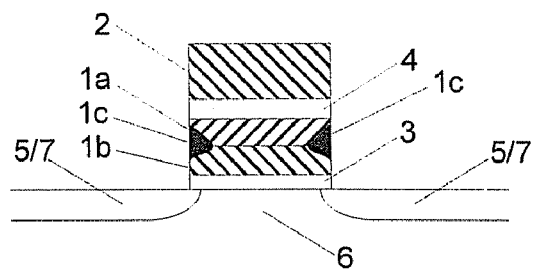
Figure 17:
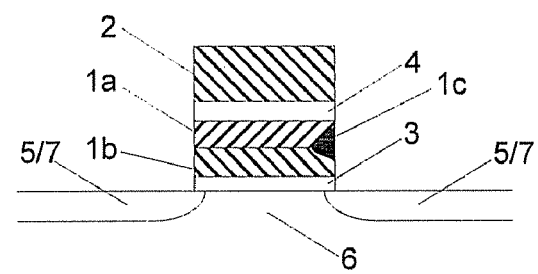
Figure 18:
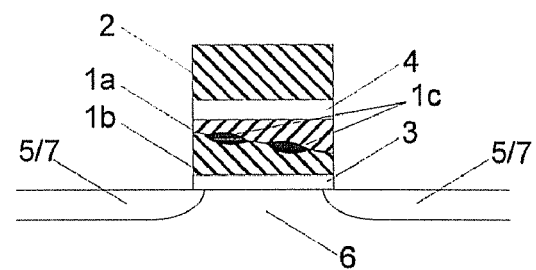

An alternative implementation is where the conductive region 1c is only present at certain regions of the cell, whereas in other regions the top region 1a and bottom region 1b are in direct contact with one another. FIG. 15 shows a case where the conductive layer 1c is not present at the edge of the floating gate 1, or parts of the edge of the floating gate 1. FIG. 16 shows a case where the conductive region 1c is only present at the edge of the floating gate 1, FIG. 17 shows a case where the conductive region 1c is present only at certain parts of the edge of the floating gate 1. FIG. 18 shows a case where the conductive region 1c comprises a number of non-connected patches.

The additional layer 1c can be conductive or a combination of conductive/non-conductive regions 1d, but preferably provides electrical contact between the first layer 1a and the second layer 1b.

An alternative embodiment is when a non-conductive layer 1d is present in between the top layer 1a and bottom layer 1b at certain places across the contact area between the top layer 1a and the bottom layer 1b of the floating gate, whereas the top 1a and bottom 1b regions remain in direct physical contact with each other at other places across the contact area. Such a non-conductive layer can result from the processing as e.g. preferred oxidation along the interface between the top layer 1 and the bottom layer 1b might occur.

These non-conductive regions 1d can consist of a uniform material. It can also consist of different regions, each one composed of a different non-conductive material. It can also contain regions, or be composed entirely of such regions, that have a continuous change of material type across the volume of the region.

Figure 19:
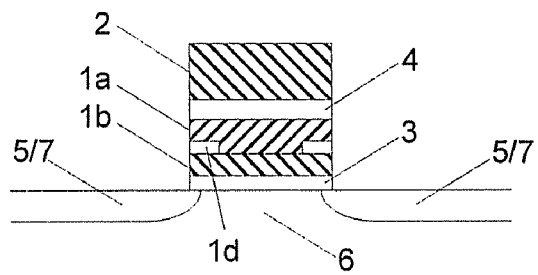
FIGS. 19-22 show schematic cross-sections of other memory cells with multiple layer floating gates according to preferred embodiments, with intermediate non-conductive regions locally between the top and bottom layers.

FIG. 19 shows a case where such a non-conductive region 1d is present at the edge of the contact area or part of the edge of the contact area.

Figure 20:
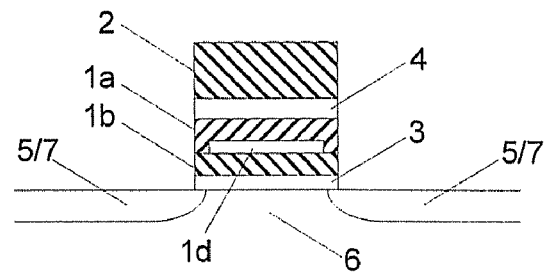

FIG. 20 shows a case where the non-conductive region 1d is not present at the edge of the contact area.

Figure 21:
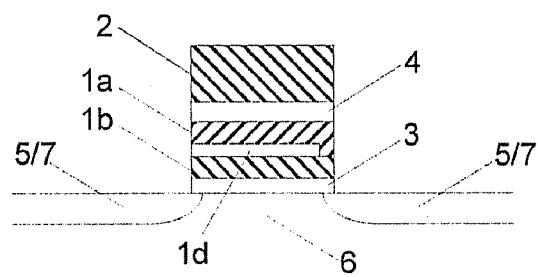

FIG. 21 shows a case where the non-conductive region 1d is not present only at certain places at the edge of the contact area.

Figure 22:
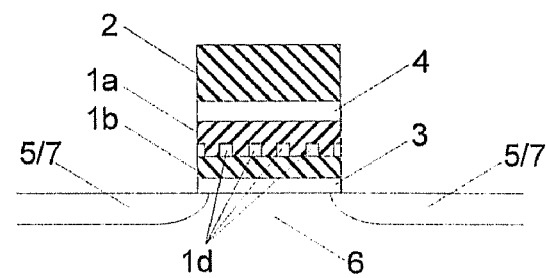
Figure 23:
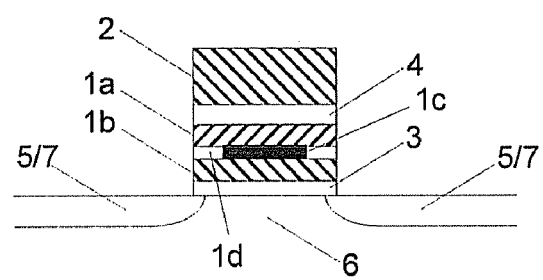
FIGS. 23-28 show schematic cross-sections of other memory cells with multiple layer floating gates according to preferred embodiments, with intermediate conductive and non-conductive regions between the top and bottom layers.
Figure 24:
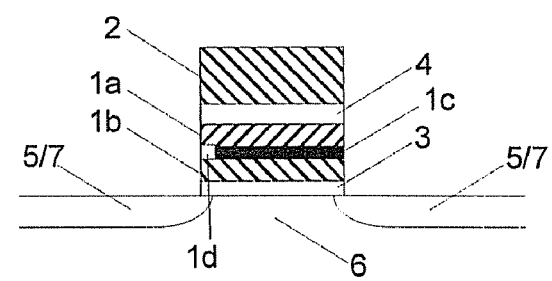
Figure 25:
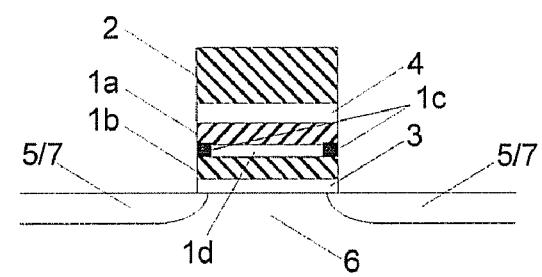
Figure 26:
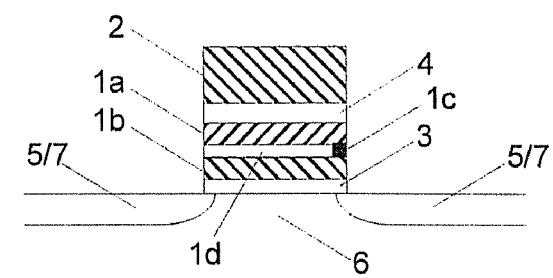
Figure 27:
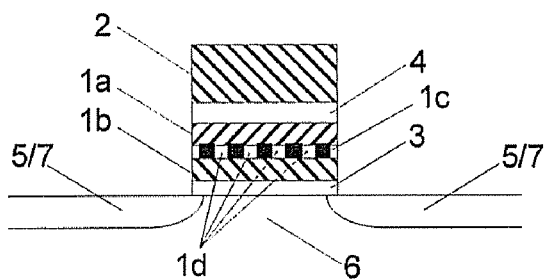

FIG. 22 shows a case where the non-conductive region 1d comprises a number of non-connected patches.

An alternative implementation is when both conductive 1c and non-conductive 1d regions are present in between the top 1a and bottom 1b layer. The conductive 1c and non-conductive 1d regions can be composed of a uniform material, but can also be non-uniform as described previously.

This combination of conductive 1c and non-conductive 1d regions in between the top layer 1a and the bottom layer 1b can help preventing layers 1a and 1b to react with each-other or to intermix. As the top 1a and bottom 1b layer are thin, and in some embodiments, top and bottom layers are combined which might react e.g. metal/silicon, an intermediate layer 1d can be inserted to prevent mixing of both layers 1a/1b. Later on a conductive path 1c can be formed to allow carriers to move from 1a to 1c and vice versa.

Figure 28:
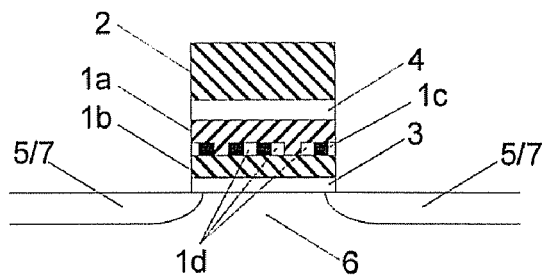

FIGS. 23 to 28 show cases where the non-conductive region 1d is present at the edge of the contact region (FIG. 23) or part of the contact area (FIG. 24), where the conductive region 1c is present at the edge of the contact region (FIG. 25) or part of the contact area (FIG. 26), where the contact area is covered with alternating patches of conducting 1c and non-conducting 1d regions (FIG. 27), and where the contact area is covered with alternating patches of conducting 1c and non-conducting 1d regions and some patches where the top 1a and bottom 1b regions are in direct contact (FIG. 28).

In the foregoing illustrative embodiments, the interface between the floating gate 1 with respectively the interpoly dielectric 4 and the tunnel dielectric 3 was of similar or about the same size. However, the floating gate 1 stack according to other embodiments can also be applied in other types of floating gate memory cells.

Figure 29:
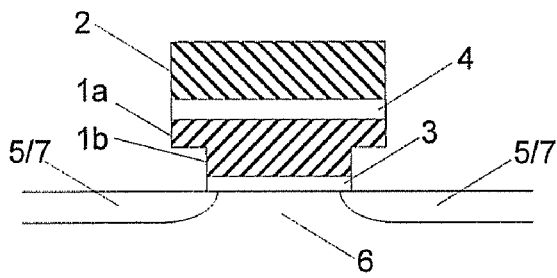
FIGS. 29-37 show schematic cross-sections of other memory cells with T-shaped floating gates according to preferred embodiments.

Alternative embodiments arise when the dual (or multiple) layer floating gate 1 as described in FIGS. 1 to 28 is combined with various alternatives of the IPD or TOX contact areas, respectively. Differentiating the contact areas will allow varying the coupling ratio CR and hence, further improving the erase/program saturation because bottom gates are not formed in a self-aligned manner whereby, e.g. the floating gate is patterned using the control gate as a mask. In the embodiment shown in FIG. 29, the floating gate and the control gate are formed in separate deposition and patterning steps.

Figure 30:
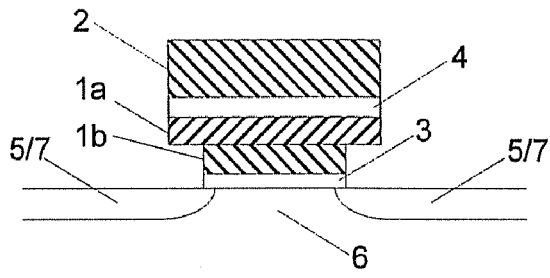
Figure 31:
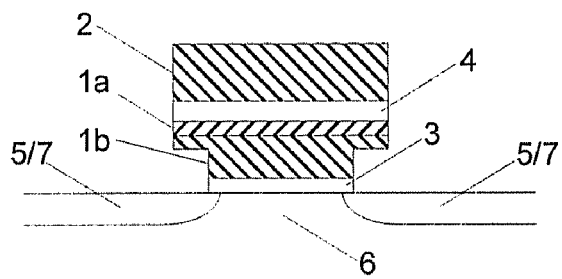
Figure 32:
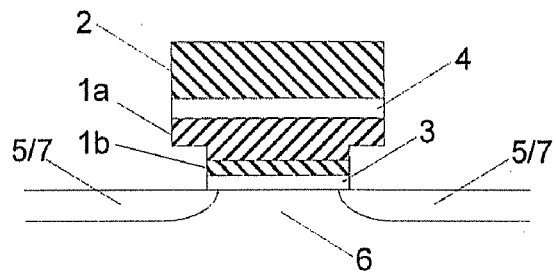

Another embodiment is where the floating gate 1 has a T-shape (FIG. 29), providing a larger area for the IPD than for the TOX. The advantage of this structure is that it has a larger coupling ratio CR. The floating gate 1 can be constructed from a bottom region 1b with small area and a top region 1a with larger area as shown in FIG. 30. Alternative implementations are shown in FIGS. 31 and 32 where the contact area between the top region 1a and bottom region 1b is situated in either the lower part of the T-shape gate or the upper part. The exact position of the contact area can depend on process variations, e.g. thicker/thinner bottom layer 1b filling a T-shaped trench formed in an oxide layer thereby exposing the channel 6. The bottom layer 1b can also be formed by depositing a thin bottom layer 1b over the sidewalls of the T-shaped oxide trench such that only the sidewalls and the channel 6 are covered, thereafter the T-shaped trench is completely filled by the top layer 1a. This will result in a floating gate 1 whereby the bottom layer 1b embraces the top layer 1a similar to the device illustrated by FIG. 9.

Figure 33:
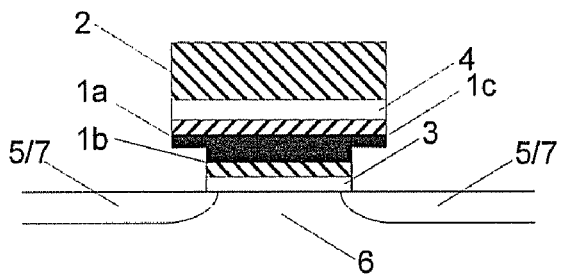
Figure 34:
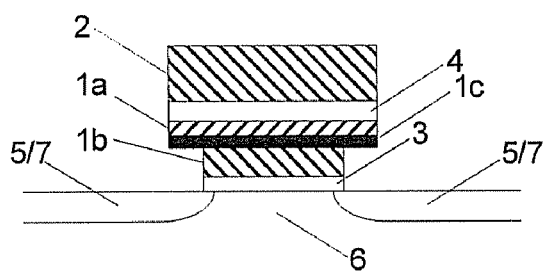
Figure 35:
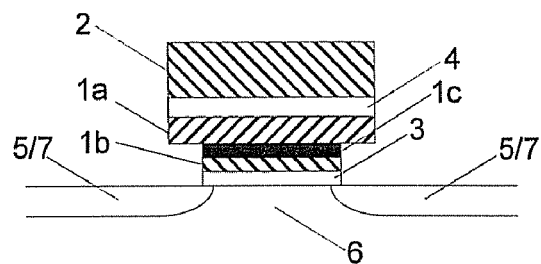
Figure 36:
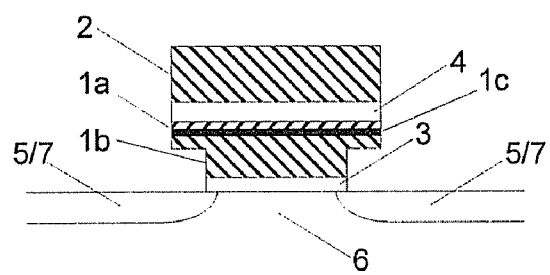
Figure 37:
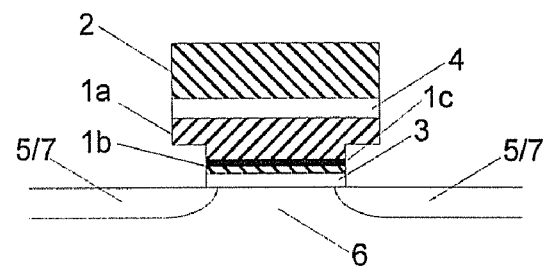

Alternative implementations can be envisaged where the contact area between the top region 1a and bottom region 1b is modified in similar ways as has been described with reference to FIGS. 13 through 28. A few examples are given in the FIGS. 33 through 37. A conductive region 1c can be present at the both sides (FIG. 33) or either side (FIGS. 34 and 35) of the contact area between the top 1a and bottom 1b regions. A conductive 1c region can also be present at the contact area in the case the contact region is situated in the upper (FIG. 36) or lower (FIG. 37) part of the T-shape as depicted in FIGS. 31 and 32.

Figure 40:
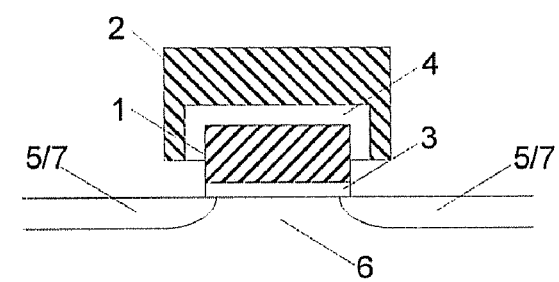
FIG. 40 shows a schematic cross-section of another memory cell according to preferred embodiments, in which the control gate partially covers the sidewalls of the floating gate.
Figure 41:
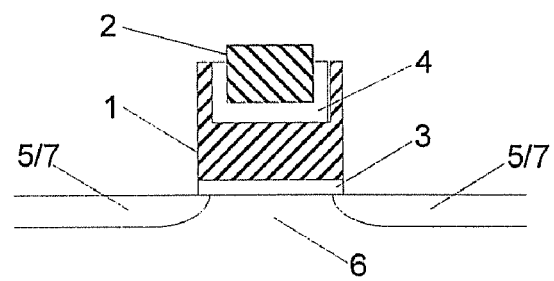
FIG. 41 shows a schematic cross-section of another memory cell according to preferred embodiments, in which the floating gate partially covers the sidewalls of the control gate.

In further alternative embodiments, the control gate 2 can be overlapping over the floating gate 1 (FIG. 38); the floating gate 1 can be overlapping over the control gate 2 (FIG. 39); the control gate 2 can cover partially or entirely the sidewall of the floating gate 1 (FIG. 40), or vice versa, the floating gate 1 can cover partially or entirely the sidewall of the floating gate 2 (FIG. 41).

Figure 42:
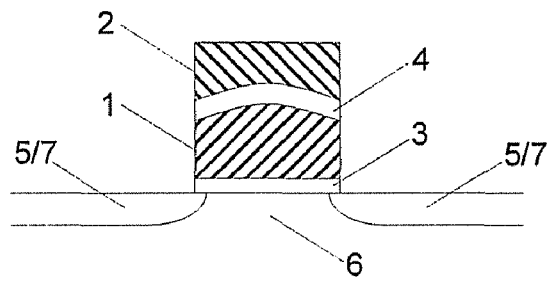
FIGS. 42 and 43 show schematic cross-sections of other memory cells according to preferred embodiments, in which the top surface of the floating gate is bent upwards/downwards.
Figure 43:
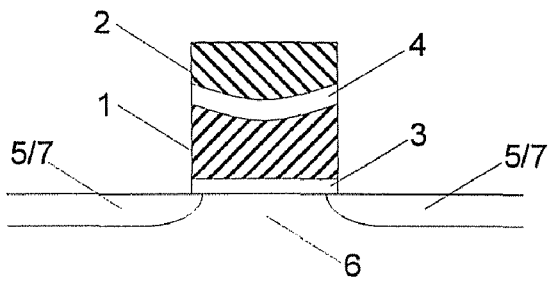

The top surface of the floating gate 1 is generally depicted to be flat, but alternatively can also be bent upwards (FIG. 42) or downwards (FIG. 43). In the latter case, this curvature of the floating gate can result from processing.

Figure 44:
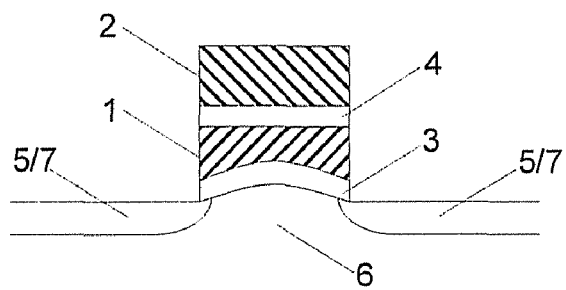
FIGS. 44 and 45 show schematic cross-sections of other memory cells according to preferred embodiments, in which the bottom surface of the floating gate is bent upwards/downwards.
Figure 45:
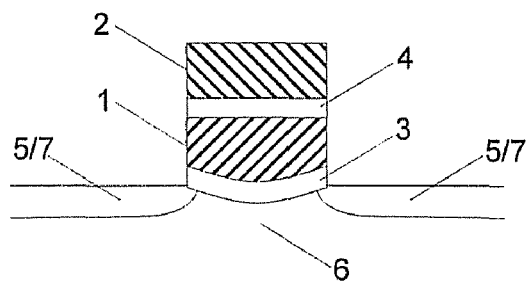

The top surface of the substrate 6 is generally depicted to be flat, but alternatively can also be bent upwards to achieve an improved control over the channel (FIG. 44—current flows perpendicular to the page) or downwards to achieve an increased channel length (FIG. 45—current flows from left to right)).

Figure 46:
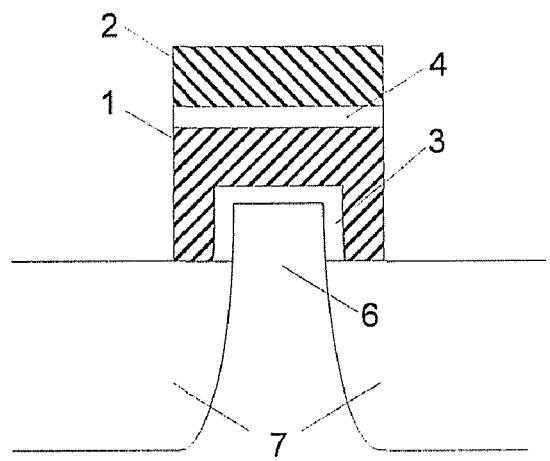
FIG. 46 shows a schematic cross-section of another memory cell according to preferred embodiments, in which the floating gate partially covers the side wall of the substrate channel region.

FIG. 46 shows an alternative where the floating gate 1 is overlapping the side wall of the substrate region 6.

Note that the floating gate region 1 shown in FIGS. 38-46 is generally depicted as a single layer, but this is done for reasons of simplicity. In particular, the floating gate region 1 in these figures may have any multiple layer construction as shown in the preceding and/or as has been described above.

Materials

The control gate 2 of the memory cell can be constructed from a uniform region of n-type doped poly silicium with a high concentration of dopants of the order of $10^{20}$ cm$^{-3}$ or above.

Alternatively, the control gate 2 can be constructed from different materials or stacks of different materials, such as p-type doped poly silicon, W, WN, Ta, TaN, metal silicides or any other control gate structure known to a person skilled in the art.

The different regions of the floating gate can be fabricated using a variety of materials and techniques.

A first possible choice for the materials of the top region 1a and/or the bottom region 1b is a semiconductor material, such as poly crystalline or amorphous Silicon. Alternatively, other materials such as Germanium, Silicon Germanium, Silicon Carbide or any other semiconductor material known to a person skilled in the art can be used.

The regions can be doped with a high concentration of atomic species to avoid substantial depletion or inversion of the semiconductor during the operation or lifetime of the device. The doping species can be applied to the layers 1a and 1b using ion implantation or during the deposition process of the regions, i.e. in-situ doping. Doping concentrations are typically of the order of $10^{20}$ cm$^{-3}$ or more. Boron is typically used for p-type doping and Phosphorus or Arsenic is used for n-type doping. Alternatively, other doping species or doping techniques can be used, as known to a person skilled in the art. The use of poly silicon is advantageous because of the ease of integration. Also, high quality IPD's can be easily created on top of poly silicon.

A second possible choice for the materials of the top region 1a and/or the bottom region 1b is a metal. Various metals can be used such as Al, Cu, AlSi, AlSiCu, AlCu, W, WN, WSiN, Ti, TiN, TiSiN, Ta, TaN, TaSiN, Pt, Au, TaCNO, Mo, or other metal known the a person skilled in the art.

The thickness of these metal layers can range from a few Angstrom to several hundreds of nanometers. The use of metals is particularly advantageous for making floating gates with very small height to reduce the capacitive coupling between adjacent cells and increase the coupling ratio by eliminating stray capacitances of the floating gate.

A third possible choice for the materials of the top region 1a and/or the bottom region 1b is a metal silicide. Metal silicides can be formed using a variety of materials including titanium, cobalt, nickel, platinum, or tungsten. Partial as well as fully siliced gate materials (FUSI) can be used. The work function of the metal silicide depends on the metal species used and the silicide formation process, as known to a person skilled in the art. The advantage of using metal silicides is that a metal region can be created using a self-aligned silicidation process, also known as salicidation, as the silicide is confined to the area where semiconductor material is in contact with the metal.

Fabrication Processes

Various fabrication processes can be envisioned for fabricating an array of memory elements. Several different fabrication processes are presented next, each one with a number of alternative implementations.

Figure 47:
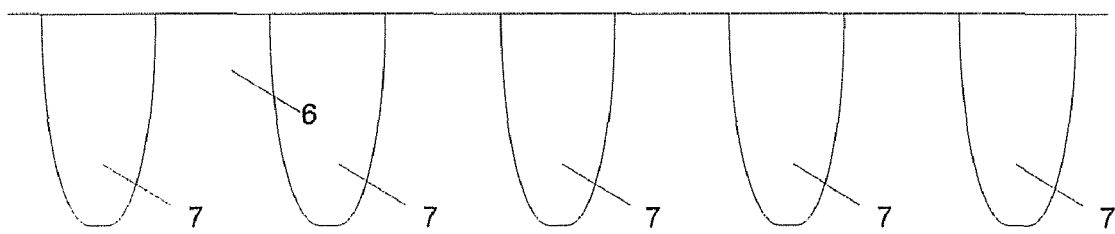
FIGS. 47-63 schematically show various process steps of a first embodiment of a fabrication process for fabrication of non-volatile memory devices.

A First Fabrication Process:

This process starts with the formation of the field isolation. Typically, the Shallow Trench Isolation (STI) technique is used for this. FIG. 47 shows a schematic cross section of the memory array after STI formation along the direction A indicated in FIG. 2. Isolating field regions 7 are formed in the semiconductor substrate 6 and an appropriate concentration and profile of dopants is introduced into the substrate 6 using ion implantation.

The next step in the fabrication process is the subsequent formation of the TOX 3 and floating gate 1 material on top of the substrate. Various ways can be used to fabricate the floating gate material as a laminar stack of different materials.

Figure 48:
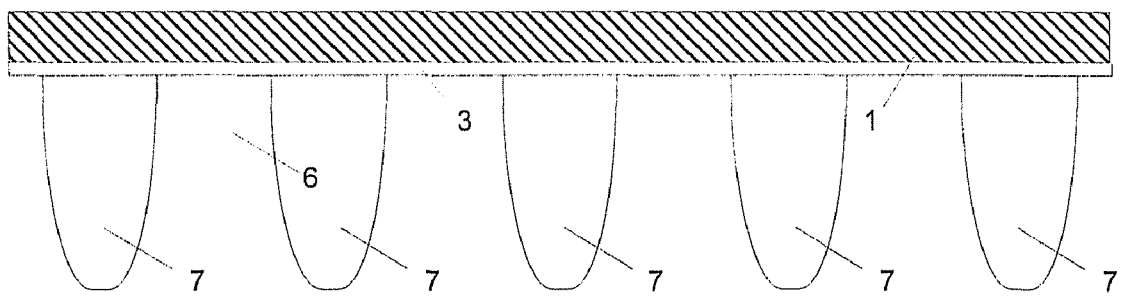

One option is the form a uniform layer 1 such as n-type poly silicon on top of the TOX 3 as shown in FIG. 48 and then for example transform the top layer of the floating gate material into a layer 1a having a higher work function than the lower part 1b. One can use for instance ion implantation to form p-type doped silicon or silicidation to form a metal silicide.

Figure 50:
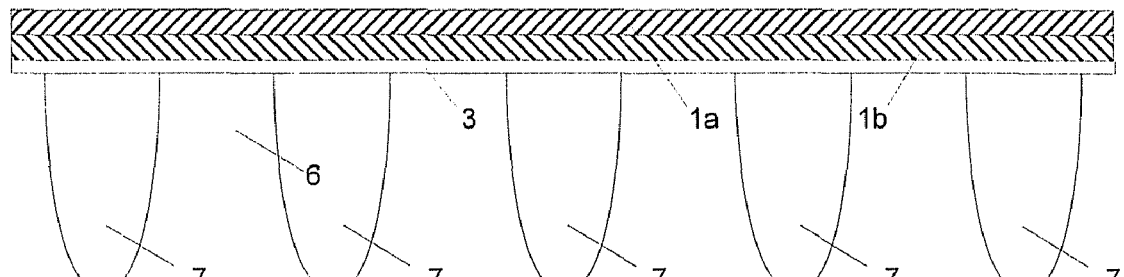
Figure 51:
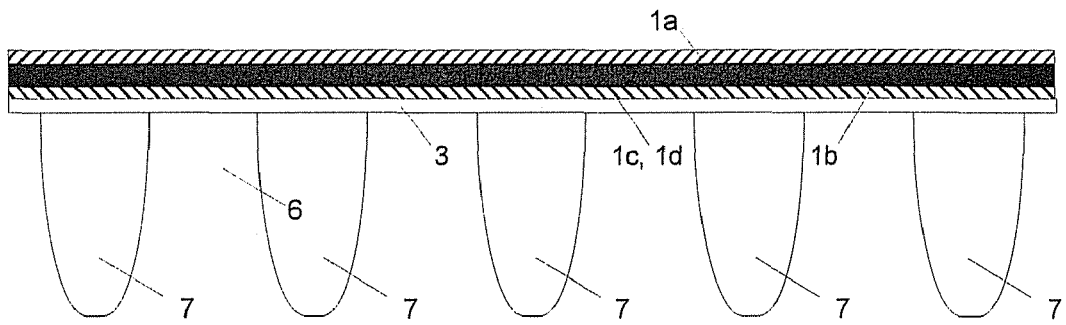

This results in a two layer floating gate stack as shown in FIG. 50, having a top layer 1a and a bottom layer 1b, or a tree- or multi-layer stack as shown in FIG. 51, having a top layer 1a, a bottom layer 1b and a contact layer 1c, 1d.

Whereas the top layer 1a and bottom layer 1b can be formed prior to the patterning of the floating gate 1, alternatively, the different layers 1a and 1b in the floating gate can be formed later after patterning of the floating gate. In the patterned gate, ions can then be implanted to create a top layer 1a with a higher work function and a bottom layer 1b with a lower work function. The top layer of the patterned floating gate 1 can also be silicided to form a top layer 1a with a work function higher than of the unsilicided bottom layer 1b.

Figure 49:
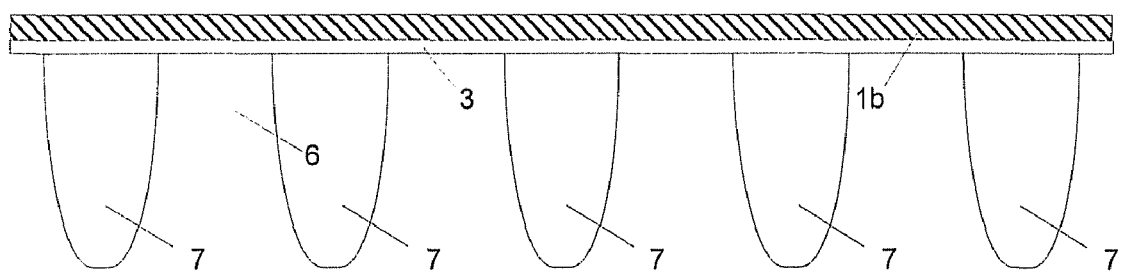

A second option is to stack the layers of the floating gate 1. A first process step or series of process steps creates a bottom layer 1b as shown in FIG. 49, using for instance CVD deposition of in-situ doped n-type poly silicon or sputtering of a n-type metal layer. Subsequent process steps then add a top layer 1a as shown in FIG. 50, using similar fabrication techniques.

Alternatively, multiple layers can be formed sequentially, one layer on top of the previous one as shown in FIG. 51. This can result in a floating gate comprising a bottom layer (1b), a top layer (1a) and conductive (1c) or non-conductive (1d) layer in between the top and bottom layers.

Figure 52:
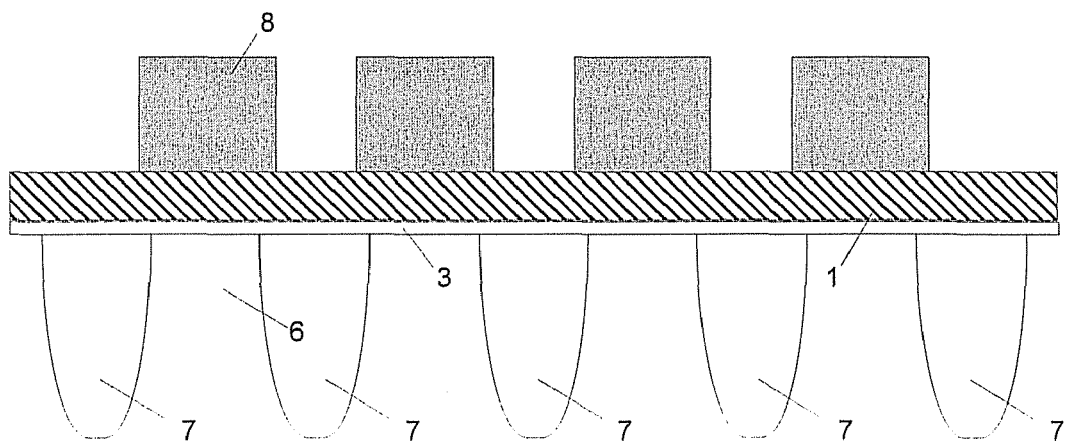
Figure 53:
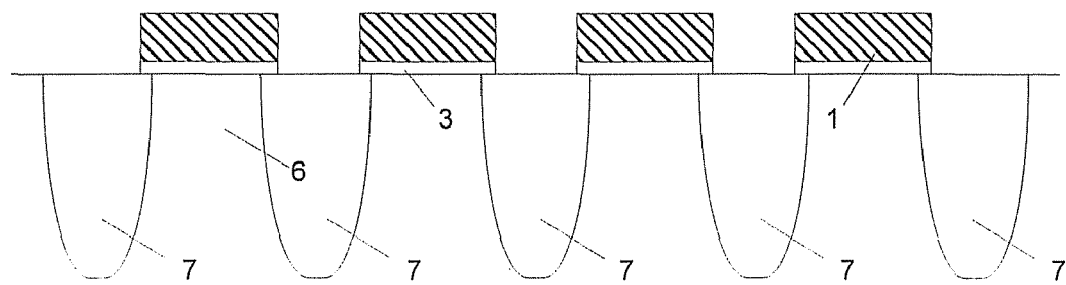

A next step, after formation of the TOX 3 and floating gate 1 layers, lithography and etch process steps can be used to pattern the floating gate 1 and possibly the TOX 3. FIGS. 52 and 53 show schematic cross sections of the memory array along the direction A indicated in FIG. 2. First, a resist pattern 8 is created on top of the floating gate 1 as shown in FIG. 52. This resist pattern 8 is then transferred into the floating gate region 1 by etching and subsequent stripping of the resist material 8 as shown in FIG. 53. The patterning process sequence is presented here in a simplified manner. Possible patterning sequences may include the use of anti-reflective coatings, hard masks, double illumination or patterning and other techniques as known by a person skilled in the art.

Figure 54:
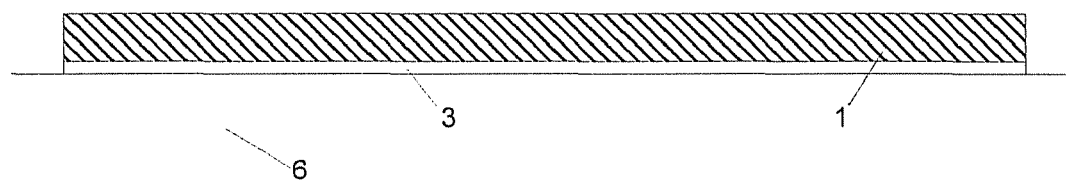
Figure 55:
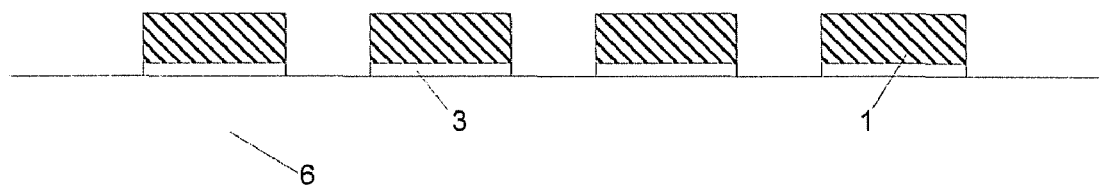

FIGS. 54 and 55 show two alternative schematic cross sections along the direction B indicated in FIG. 2. The floating gate 1 can be patterned in longer stripes as shown in FIG. 54. The individual floating gate regions of each memory cell can be separated from one another later on in the process during the formation of the control gate. Alternatively, the patterning of the floating gate 1 immediately singles out each of the individual floating gate regions for each memory cell as shown in FIG. 55.

Figure 56:
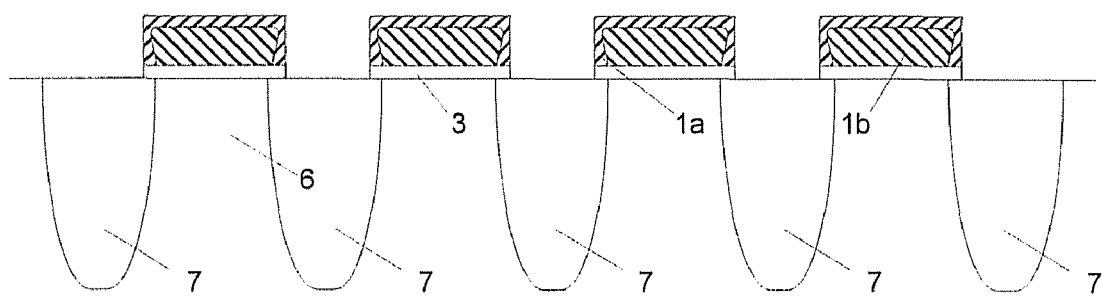

In a next step, after patterning of the floating gate, additional process steps can be applied to define, or further define, the top region 1a and bottom region 1b if these layers where not already formed prior to the patterning step. This is shown in FIG. 56 resulting in the device illustrated by FIG. 11. Additional process steps can include doping techniques such as ion implantation, silicidation, or deposition of thin layers and subsequent Reactive Ion Etching (RIE) to form spacers at the sidewalls of the floating gate 1.

In a next step, after formation of the floating gate, the space 9 between the different regions of floating gate 1 can be filled with a dielectric such as silicon dioxide or silicon nitride using deposition and Chemical Mechanical Polishing (CMP). The result is shown FIG. 57.

Figure 58:
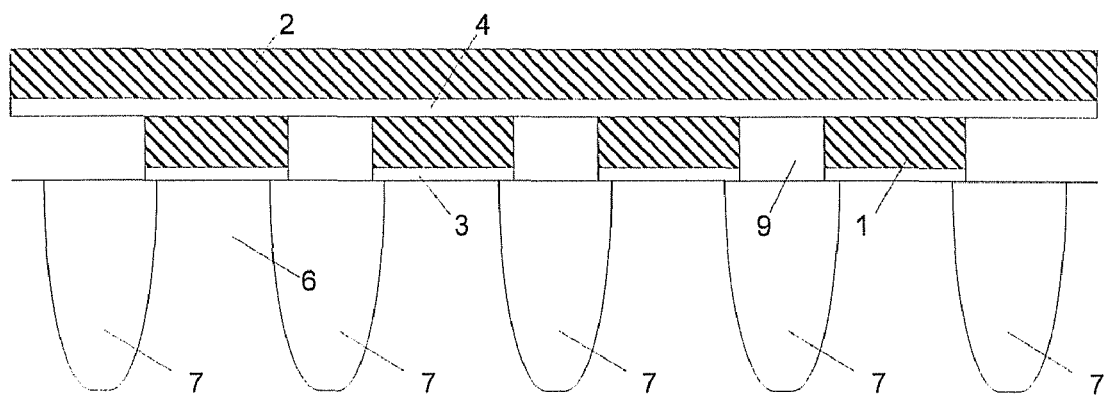

In a next step the IPD 4 and control gate 2 can be formed as shown in FIG. 58.

Figure 59:
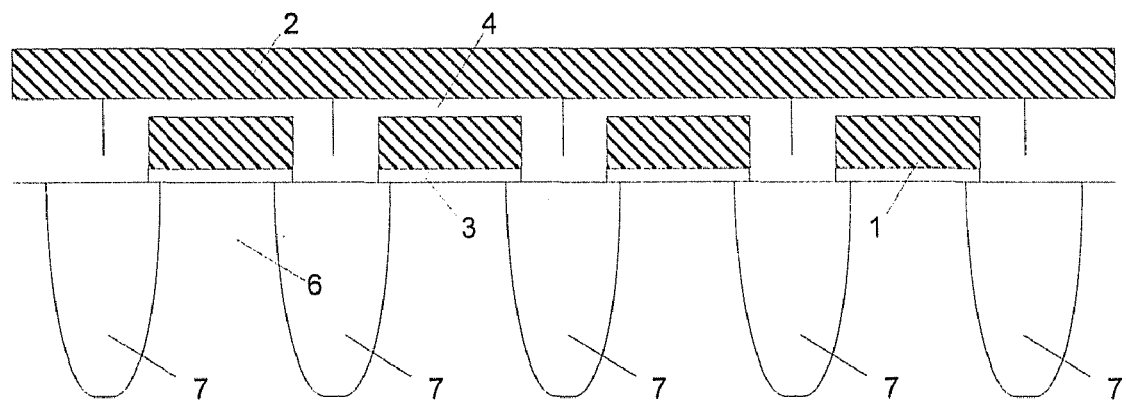
Figure 60:
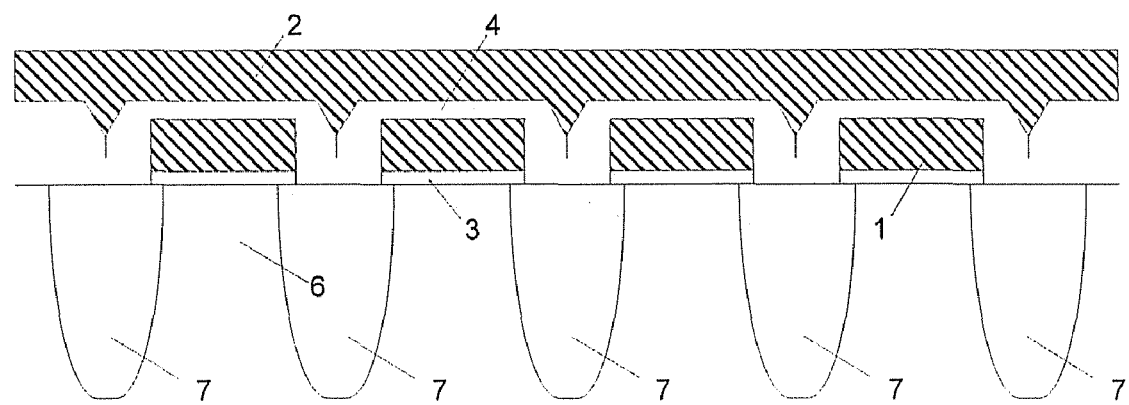

FIGS. 59 and 60 illustrate how the control gate can be formed to at least partially embrace the sidewalls of the floating gate. If the space between the individual floating gates is not completely filled by the oxidation 9, grooves will be formed. These grooves can later on be filled with the material of the control gate. Such a sequence will result similar to the ones shown in FIG. 40.

Subsequent process steps can pattern the control gate 2 in long stripes along the direction B of the memory array indicated in FIG. 2.

Figure 38:
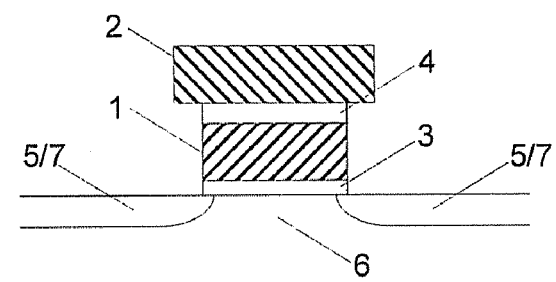
FIG. 38 shows a schematic cross-section of another memory cell according to preferred embodiments, in which the control gate overlaps over the floating gate.
Figure 39:
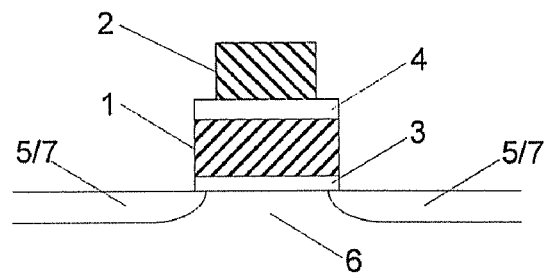
FIG. 39 shows a schematic cross-section of another memory cell according to preferred embodiments, in which the floating gate overlaps over the control gate.
Figure 61:
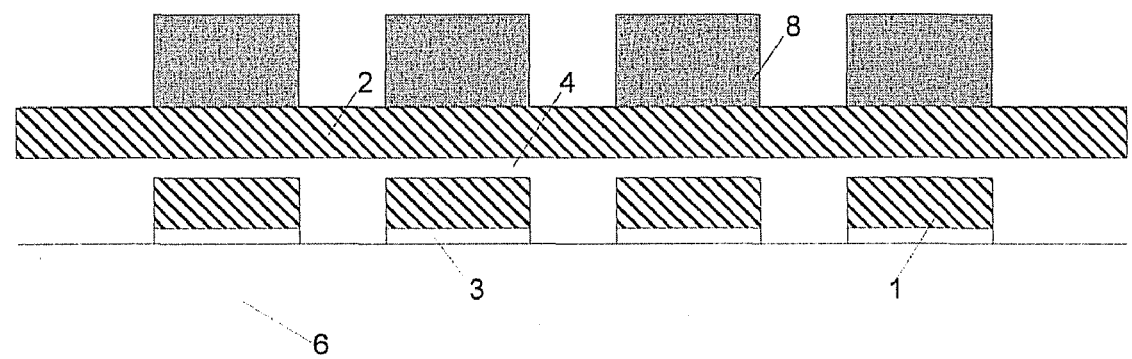
Figure 63:
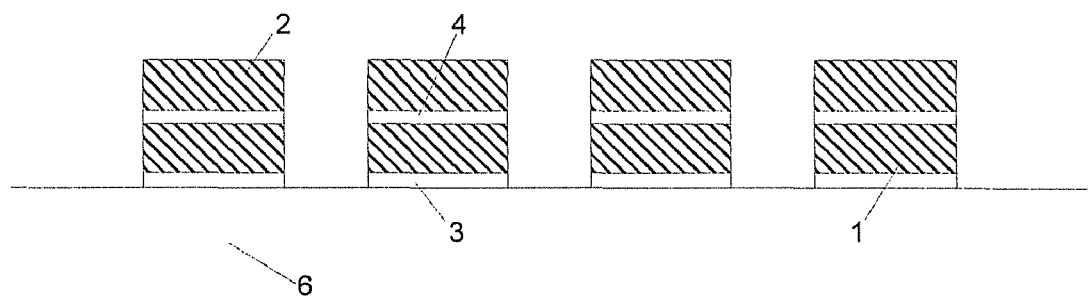

FIG. 61 shows the case where the floating gate material 1 is patterned in individual regions for each memory cell individually as shown in FIG. 55. A pattern of photo resists 8 is formed on top of the control gate material 2 using photo lithography. The resist pattern 8 is subsequently transferred into the control gate material 2 using etching techniques such as RIE and the resist material is stripped. This results in the cross section shown in FIG. 63. The advantage of this process sequence is that over- or underlap between the floating gate and control gate can be realized as indicated in FIGS. 38 and 39 as floating gate and control gate are patterned in separate patterning steps.

Figure 62:
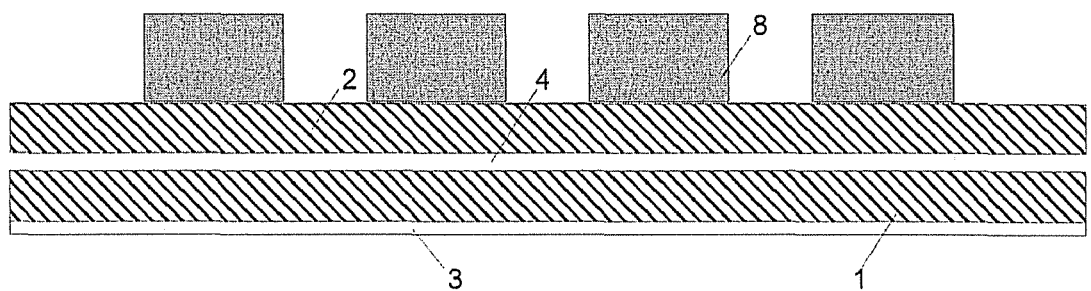

Alternatively, the floating gate material can initially be patterned in long stripes according to the process sequence depicted in FIG. 54 instead of being patterned in individual, separated floating gates each corresponding to a memory cell. In this case, a pattern of photo resists 8 can be formed on top of the control gate 2 using photo lithography as shown in FIG. 62. The resist pattern 8 is subsequently transferred into the control gate material 2 and floating gate material 1 simultaneously using etching techniques such as RIE and the resist material is stripped. This results in the cross section shown in FIG. 63. The advantage of this process sequence is that the control gate 2 and floating gate 1 are self-aligned.

Subsequent process steps can include the formation of the source and drain extensions, spacers, source and drain junctions, thermal activation of the dopants, salicidation of source and drain and control gate regions and back-end processing to form the metal interconnects, as known to a person skilled in the art. Also, other semiconductor components such as high voltage or logic MOS transistors can be formed on the same substrate using additional process steps. These additional process steps can be included in the fabrication process before, during or after the formation of the memory cells as described here.

A Second Fabrication Process:

Whereas in the first fabrication process starting from FIG. 47, the floating gate was not aligned to the field isolation, the second fabrication process allows for self-aligning the floating gate 1 to the field isolation 7.

Figure 64:
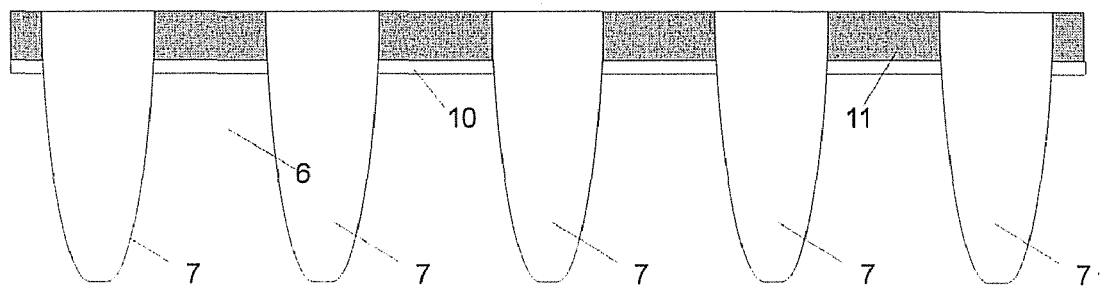
FIGS. 64-73 schematically show various process steps of a second embodiment of a fabrication process for fabrication of non-volatile memory devices.

A conventional Shallow Trench Isolation (STI) field isolation process scheme starts with depositing a thin oxide liner 10 and a thicker silicon nitride layer 11. The silicon nitride layer 11, oxide liner 10 and isolation trenches 7 are patterned using photo lithography and Reactive Ion Etching. Subsequently, the trenches 7 are filled with a dielectric, typically silicon dioxide, and the structure is planarized using Chemical Mechanical Polishing (CMP). FIG. 64 shows a schematic cross section of the resulting structure along the direction A of the memory indicated in FIG. 2. Conventional STI processing then proceeds with etching back the field isolation regions 7 and removing the silicon nitride 11 and oxide liner 10. However, for the fabrication of memory cells with a self-aligned floating gate, a different process sequence can be used.

Figure 65:
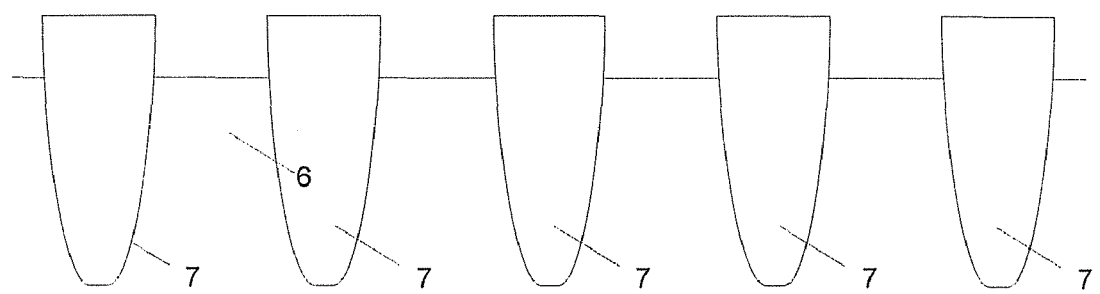

First, the silicon nitride regions 11 and oxide liner 10 are removed, typically using a wet etch, as shown in FIG. 65, such that the filled trenches 7 extend above the exposed surface of the substrate 7.

Figure 66:
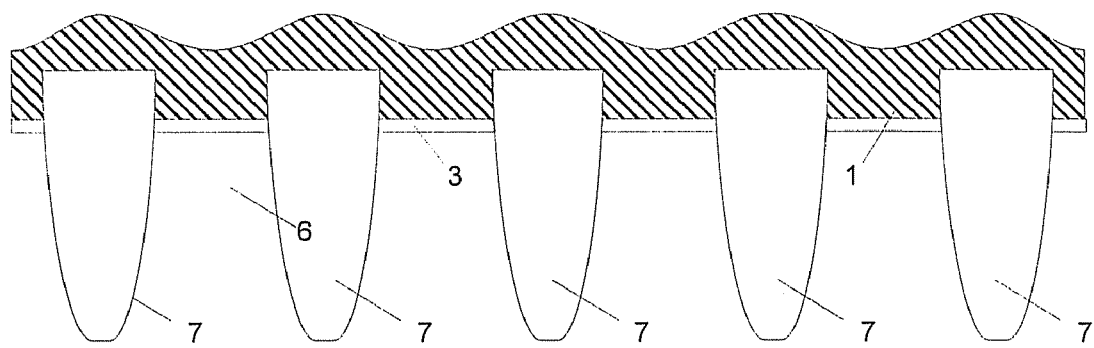

Then the TOX region 3 and the floating gate material 1 are deposited as shown in FIG. 66. For clarity, the TOX region 3 is only drawn below the floating gate material 1, but in principle can also be present on the sidewalls and top of the field regions 7.

Figure 67:
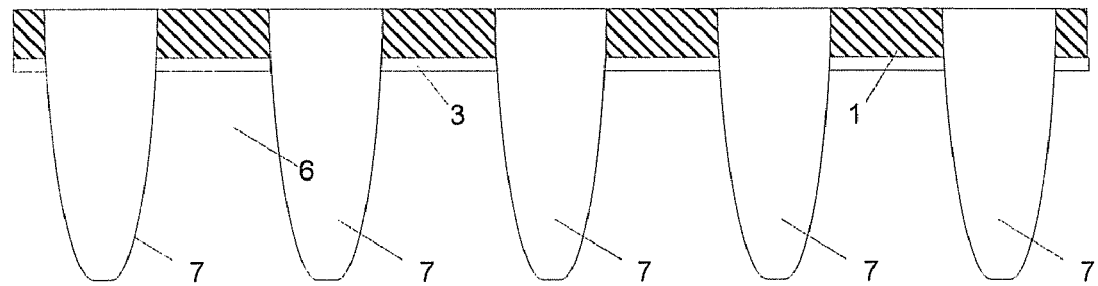

Subsequently, the floating gate material 1 is planarized using CMP to form isolated stripes of floating gate material 1 as shown in FIG. 67. The advantage of this process scheme is that the floating gate material is properly sealed off at the edges.

Once the floating gate is patterned, in this case by filling spacings in between the field isolation regions 7, the formation of the top layer 1a and the bottom layer 1b in this floating gate can be done.

Contrary to a prior art process flow where the floating gate material is typically a uniform layer of in-situ doped n-type poly silicon, here, a dual or multi-layer floating gate material is fabricated as explained in relation to FIGS. 48 through 51.

Figure 68:
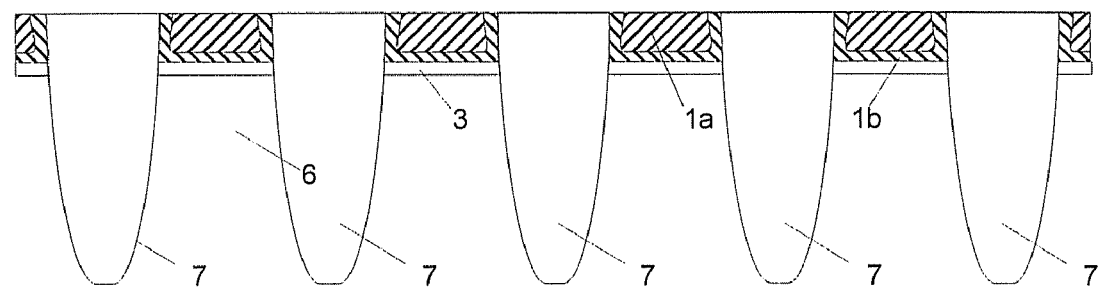

As an example, FIG. 68 shows a floating gate material where the top region 1a is deposited on top of a bottom region 1b that is substantially thinner than the spacing between the cells. In this embodiment a thin bottom layer 1b is formed at least over the sidewalls and on the bottom of the spacing between the field isolation regions 7. As this is a thin layer this spacing is not completely filled. Thereafter the top layer 1a is deposited at least filling the spacing. Any material of the layers 1a and 1b in excess of the field isolation region 7 can be removed by polishing or etch back. This leads to a configuration of top region 1a and bottom region 1b as explained with reference to FIG. 9.

Figure 69:
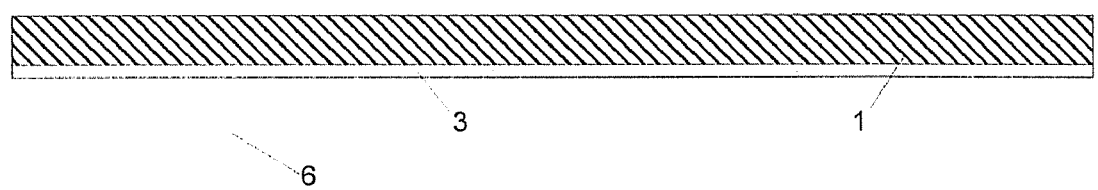

Alternatively, the self-aligned floating gate can be formed by depositing the floating gate material 1 and tunnel dielectric 3 on the substrate 6 prior to STI formation as shown in FIG. 69. Here the floating gate is then patterned and used as a mask to pattern the trenches of the field isolation region 7. Subsequent processing of the conventional STI leads to the structure shown in FIG. 70. The advantage of this process sequence is the low number of process steps required as no oxide liner 10, nitride layer 11 needs to be deposited nor to be patterned.

Figure 70:
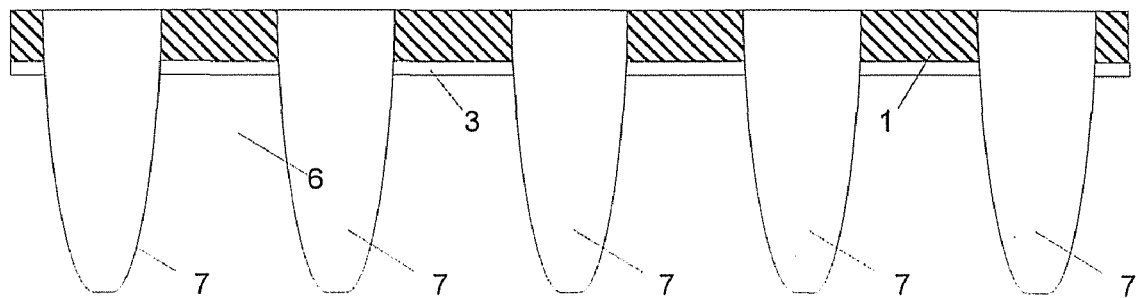
Figure 71:
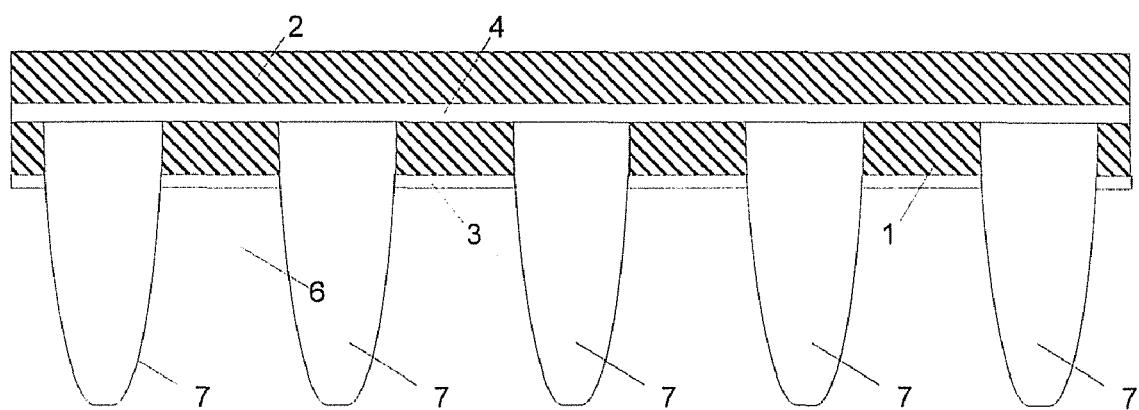

After forming the floating gate self-aligned to the field isolation regions 7, processing then proceeds by forming the IPD 4 and control gate regions 2 on top of the planarized structure of FIG. 70, as shown in FIG. 71.

Figure 72:
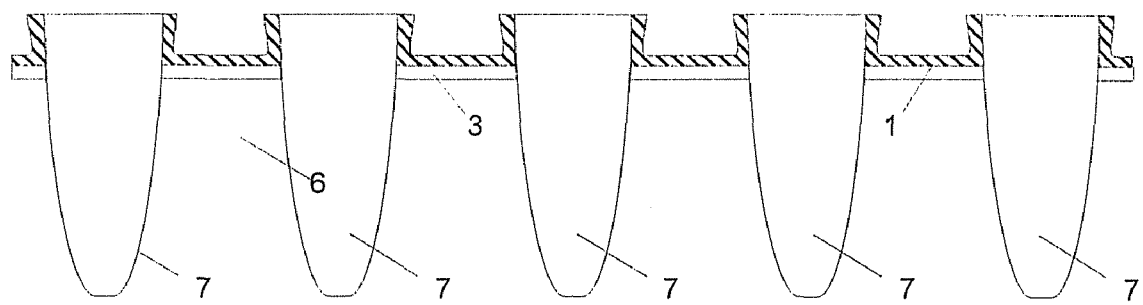
Figure 73:
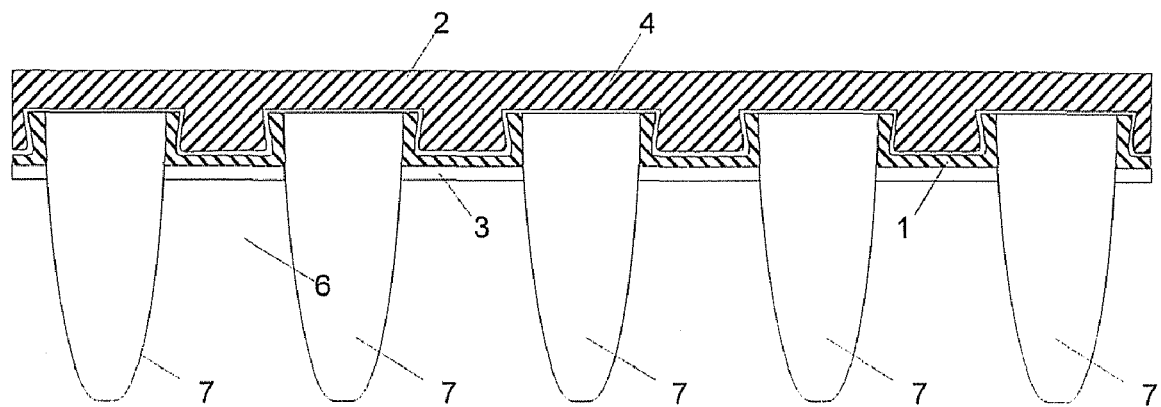

Alternatively, the floating gate 1 material in its entirety can be substantially thinner than the spacing between the memory cells, leading to the structure shown in FIG. 72. In similar ways as described in relation to FIGS. 62 and 64, top layer 1a and bottom layer 1b can be formed in the floating gate 1 material. Subsequently, the IPD 4 and control gate 2 are deposited on this structure depicted in FIG. 72, leading to the resulting structure as shown in FIG. 73. This embodiment provides a larger interface area with the control gate 2 than with the channel region 6, so that a larger coupling ratio CR can be realized.

A Third Fabrication Process:

The third process allows for the formation of T-shaped floating gates as depicted in FIG. 30.

In a first embodiment the floating gate 1 is formed in a self-aligned manner to the field isolation region 7. It starts from the process flow for fabrication of self-aligned floating gates as discussed in relation to FIG. 64.

Figure 74:
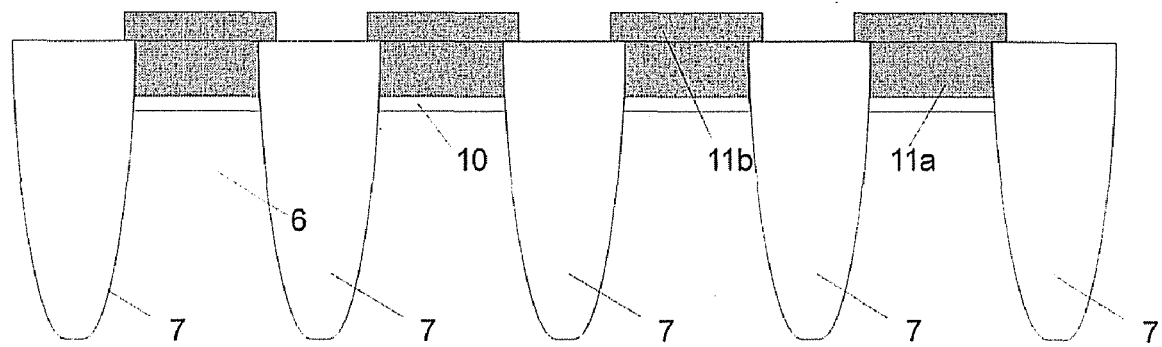
FIGS. 74-81 schematically show various process steps of a third embodiment of a fabrication process for fabrication of non-volatile memory devices.

After planarization of the field oxide regions 7 as shown in FIG. 64, an additional silicon nitride layer 11b is deposited and patterned using photo lithography and etch process steps to obtain the structure shown in FIG. 74.

Figure 75:
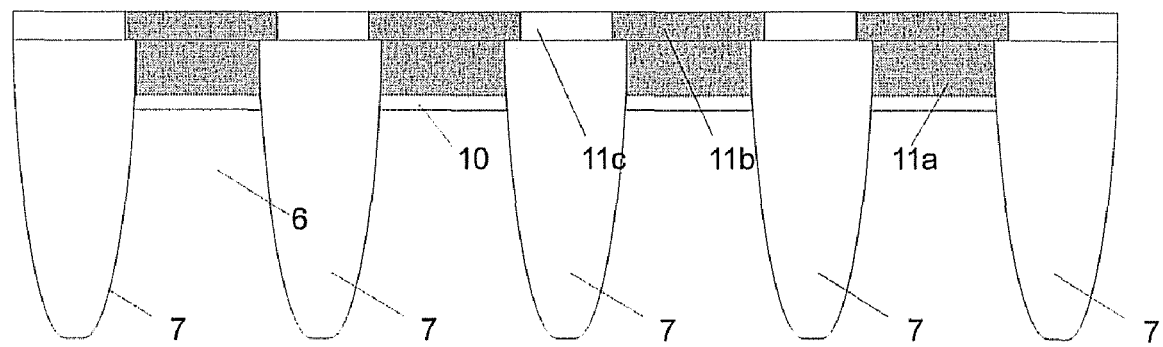

Subsequent oxide deposition and planarization using CMP allows for filling the spaces 11c between the additional silicon nitride regions 11b, as shown in FIG. 75.

Figure 76:
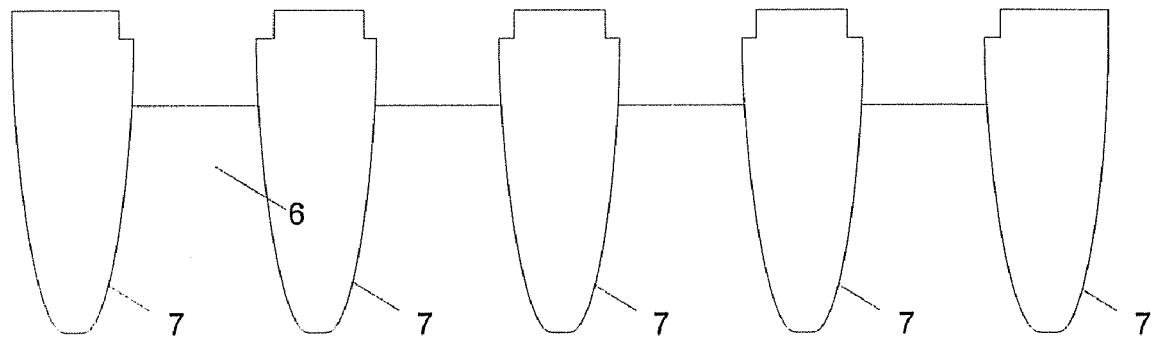

Subsequently, the silicon nitride regions 11a and 11b as well as the oxide liner 10 are removed using etch process steps, leading to the structure shown in FIG. 76.

Further processing continues as described previously in relation to FIGS. 66 (depositing of floating gate material), and 67 (planarizing of the floating gate) or 68 (formation of at least top 1a and bottom layer 1b in the floating gate) or 72 (floating gate partially filling the created trench).

Figure 77:
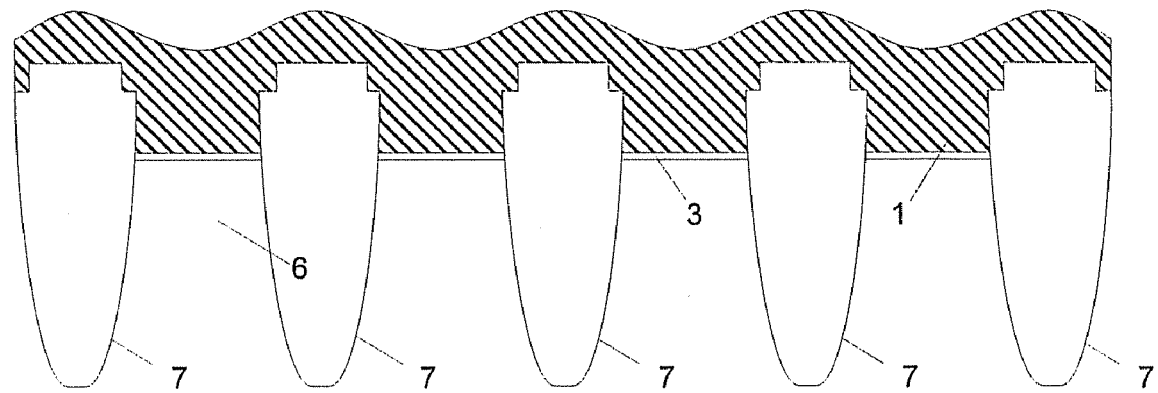
Figure 78:
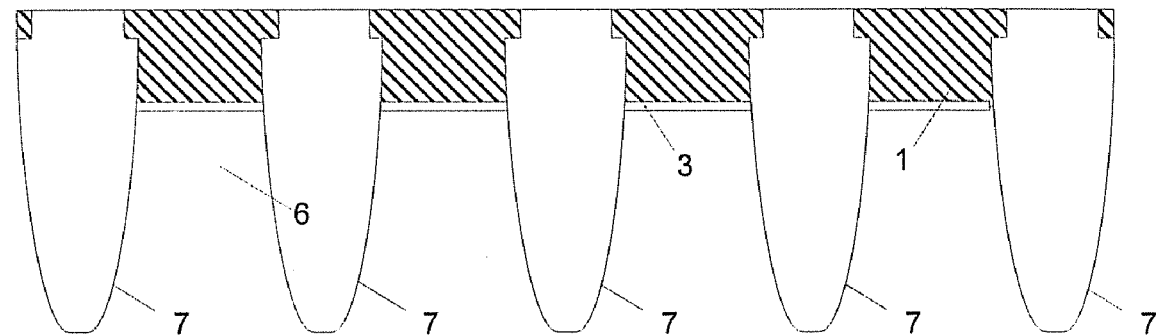

The process sequence is further exemplified by FIGS. 77 and 78. First, TOX 3 and floating gate material 1 are deposited as shown in FIG. 77, then the floating gate material 1 is planarized as shown in FIG. 78 for example by using CMP.

Figure 79:
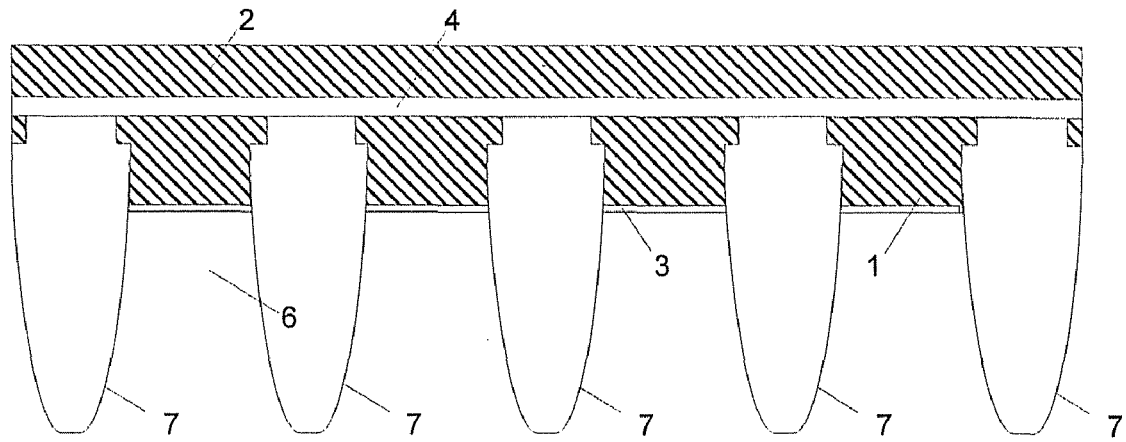

The process is then continued by the formation of the IPD 4 and control gate material 2 as shown in FIG. 79, in a similar way as the control gate formation explained before.

Figure 57:
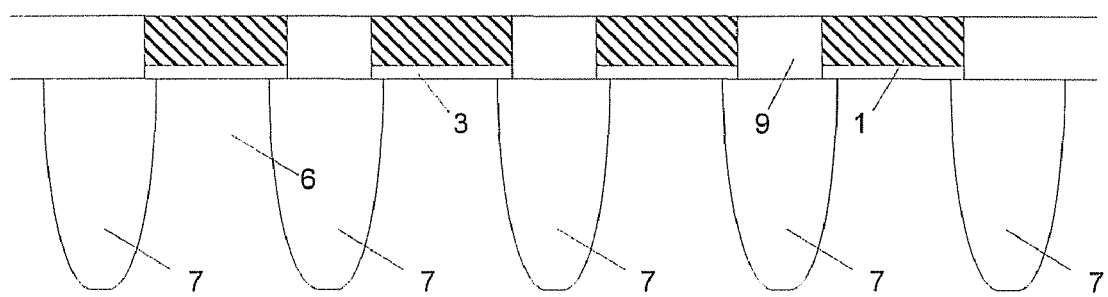
Figure 80:
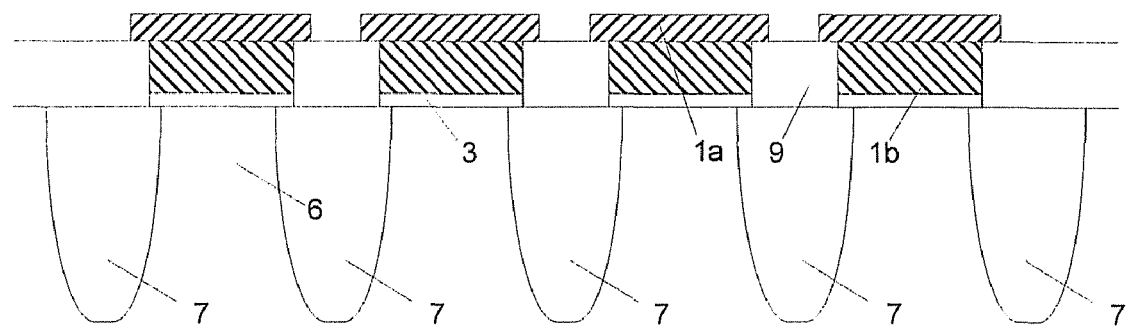
Figure 81:
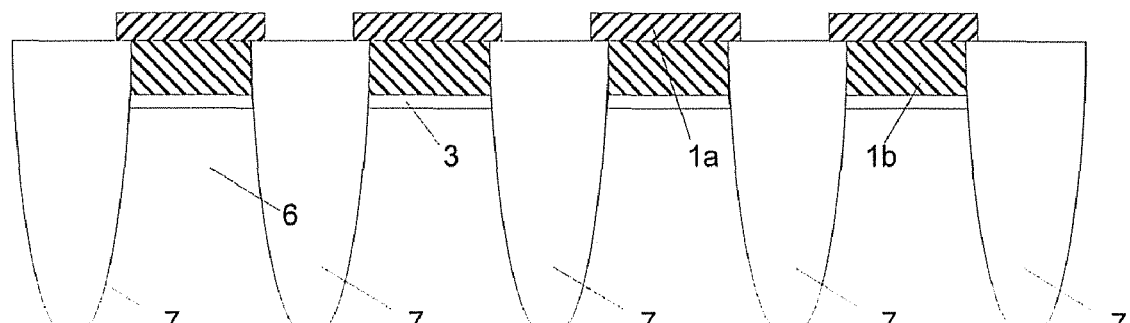

In a second embodiment, the floating gate is not formed completely self-aligned to the field isolation regions 7 as in the first embodiment of this third process flow, but the T-shape is realized by additional formation of floating gate regions 1, starting from the non-self aligned structure shown in FIG. 57, or the self-aligned structure shown in FIG. 67. On top of the planarized material of the floating gate, a second layer 1a of the floating gate material is deposited and patterned. This leads to the T-shaped floating gate structures shown in FIGS. 80 and 81 respectively. This embodiment allows first forming the bottom layer 1b in the spacing in between the field regions 7 and the top layer 1a on top of the bottom layer 1b which is embedded in surrounding dielectric material 7, 9. Further processing is then carried out to form the IPD 4 and control gate 2 as described above.

In General

In all the structures described above, the materials of the substrate 6, the floating gate 1 and control gate 2, irrespective of the fact that each of these may be constructed in multiple materials, are selected such that the work functions at the interfaces with the TOX 3 and the IPD 4 meet the following requirements.

Figure 82:
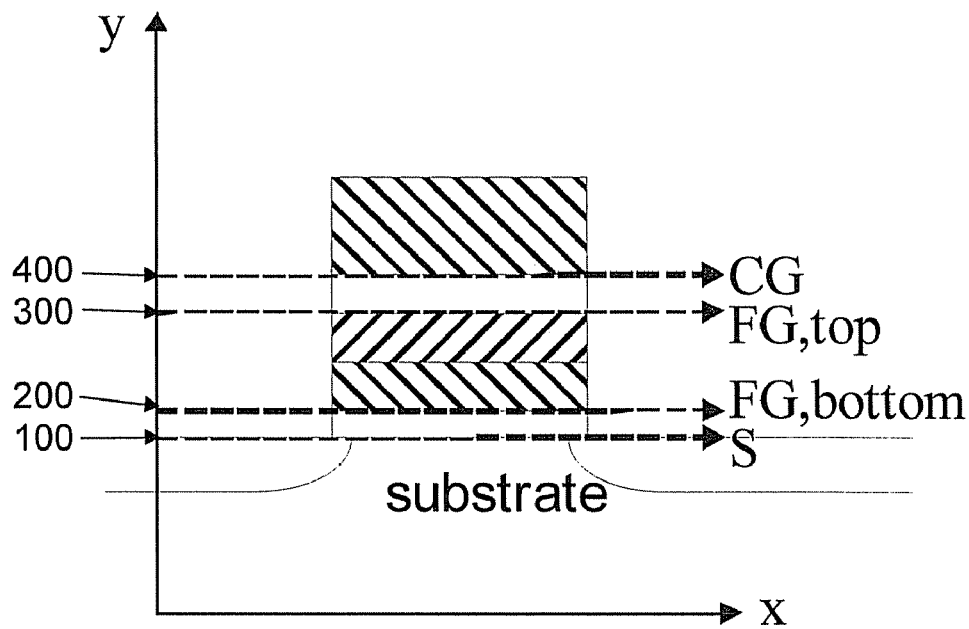
FIG. 82 shows a schematic cross-section of a generally preferred embodiment of a floating gate memory cell comprising a stack of a control gate electrode (CF), a (multilayer) floating gate electrode (FG) having a top layer adjacent the control gate electrode (CG) and a bottom layer adjacent to the substrate.

FIG. 82 shows a schematic cross-section of a preferred embodiment of a floating gate memory cell comprising a stack of a control gate electrode (CF), a (multilayer) floating gate electrode (FG) having a top layer adjacent the control gate electrode (CG) and a bottom layer adjacent to the substrate. The control gate electrode is separated from the floating gate electrode by a dielectric stack, known as inter-poly-dielectric (IPD). The floating gate electrode is separated from the substrate (S) by a dielectric stack known as tunnel dielectric (TOX). Note that it is not essential that either of the dielectrics, nor the floating and control gates are constructed as multiple layers, i.e. they may also be formed by a single layer or a single material.

In this FIG. 82, the "S"-interface 100 is the contact surface between the channel region of the substrate and the tunnel dielectric, the "FG,bottom"-interface 200 is the contact surface between the tunnel dielectric and the floating gate, the "FG,top"-interface 300 is the contact surface between the floating gate and the interpoly dielectric and the "CG"-interface 400 is the contact surface between the interpoly dielectric and the control gate.

According to preferred embodiments, it is a requirement that the minimum value of the work function(s) of the material(s) of the control gate electrode at the interface 400 with the inter-poly-dielectric is larger than the maximum value of the work function(s) of the material(s) of the floating gate electrode at the interface 200 with the tunnel dielectric, as well as that the minimum value of the work function(s) of the material(s) of the floating gate along the interface 300 with the inter-poly-dielectric is larger than the maximum value of the electron affinity/ties of the material(s) of the semiconductor substrate along the interface with the tunnel dielectric, i.e.:

$$\min[\phi_{CG}] > \max[\phi_{FG,bottom}] \quad \text{(eq. 1)}$$

&

$$\min[\phi_{FG,top}] > \max[\chi_s]$$

wherein $\phi_{CG}$ is the work function of the CG at the interface 400; $\phi_{FG,bottom}$ is the work function of the FG at the interface 200; $\phi_{FG,top}$ is the work function of the FG at the interface 300; and $\chi_S$ is the semiconductor electron affinity at the interface 100.

Figure 83:
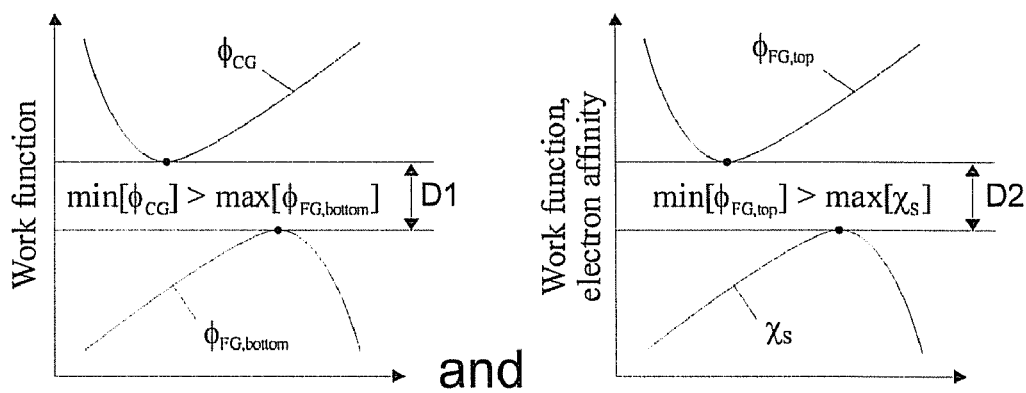
FIG. 83 illustrates the work function requirement applicable to all embodiments for the control gate electrode and the floating gate electrode (left) and for the floating gate electrode and the substrate (right).

FIG. 83 illustrates the work function requirement for the control gate electrode and the floating gate electrode (left) and for the floating gate electrode and the substrate (right). The gap D1 and D2 is each time a predetermined gap which is built into the memory device to suppress programming/erase saturation, i.e. flow-through and gate injection (see FIG. 85).

In preferred embodiments, in addition to the requirements listed above, there is also a requirement regarding the relative value of the work function at the top interface of the floating gate 300 with respect to that at the bottom interface of the floating gate 200, namely that the minimum value of the work function of the floating gate along the interface 300 with the inter-poly-dielectric is larger than the maximum value of the work function of the floating gate along the interface 200 with the tunnel dielectric, i.e.:

$$\min[\phi_{FG,top}] > \max[\phi_{FG,bottom}] \quad \text{(eq. 2)}$$

wherein $\phi_{FG,bottom}$ is the work function of the bottom interface 200 of the floating gate and $\phi_{FG,top}$ is the work function of the top interface 300 of the floating gate.

Figure 84:
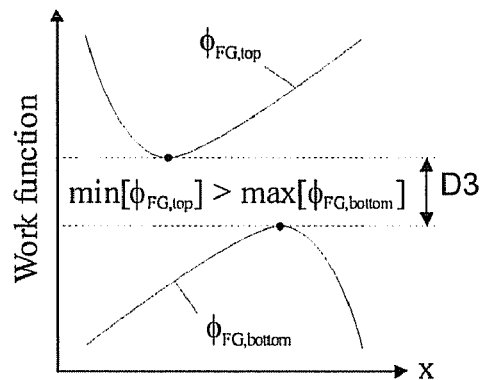
FIG. 84 illustrates an additional work function requirement applicable to preferred embodiments.

FIG. 84 illustrates this additional work function requirement. Again there is a predetermined gap D3.

Figure 85:
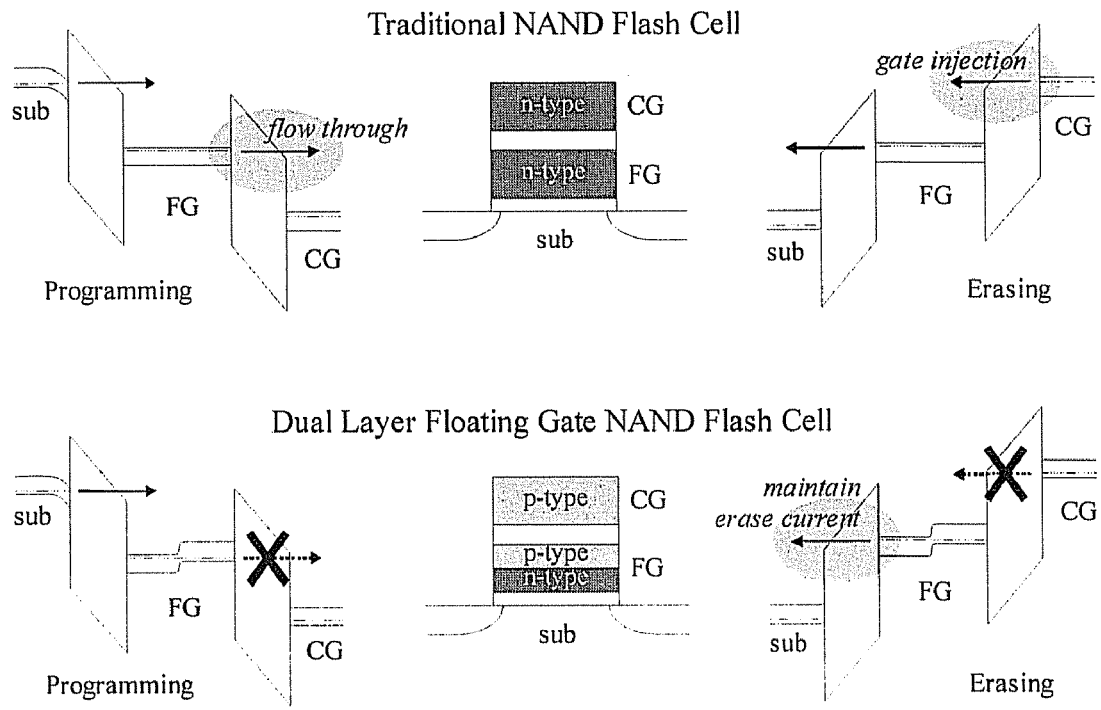
FIG. 85 shows a comparison between a preferred embodiment of floating gate cell structure, meeting the requirements of FIGS. 83 and 84, with a conventional floating gate cell structure.

Both requirements eq. 1 and eq. 2 are fulfilled with the non-volatile memory device having the dual layer floating cell gate structure shown in FIG. 85, which is compared with a conventional floating gate cell structure. The dual layer floating gate cell structure comprises a floating gate with an n-type bottom layer, a p-type top layer and a p-type control gate. On the left and right, the impact during programming and erasing is shown. In the conventional cell, due to the coupling ratio of 0.5, the flow through current through the IPD may equal the tunnel current through the tunnel oxide upon programming, so that substantially no charge remains on the FG. Similarly, during erasing, the gate injection current may equal the erase current towards the substrate. With the cell according to this preferred embodiment, upon programming the barrier at the FG-IPD-interface 300 is increased (with respect to the barrier at the substrate-TOX-interface 100) so that flow through can be suppressed and likewise upon erase the barrier at the CG-IPD-interface 400 is increased (with respect to the barrier at the FG-TOX-interface 200) so that gate injection can be suppressed.

It should be noted that many other material combinations and cell structures for which at least the requirement of eq. 1 is fulfilled are possible, such as for example a p-type control gate in combination with one of the following floating gate implementations:
N-type poly bottom, p-type poly top
N-type metal bottom, p-type poly top
N-type poly bottom, p-type silicide top
N-type metal bottom, p-type silicide top
N-type metal bottom, n or p-type poly middle, p-type silicide top
N-type metal bottom, n or p-type poly middle, p-type metal top In some embodiments, the following combination of materials for the top and bottom layers of the floating gate electrode and the substrate are possible:

| | Floating gate: top layer | Floating gate: bottom layer | Substrate |
|---|---|---|---|
| 1 | First semiconductor | Third Semiconductor | Second Semiconductor |
| 2 | First Semiconductor | Metal | Second Semiconductor |
| 3 | Metal | Metal | Second Semiconductor |
| 4 | Metal | Semiconductor | Second semiconductor |

The material of the bottom layer is preferably selected such that, in the case of a semiconductor material, it has a bandgap equal to or larger than the bandgap of the semiconductor substrate. Preferably, the substrate and the bottom layer are formed of the same semiconductor material. An example is a silicon bottom layer in combination with a silicon substrate.

The material of the bottom layer is preferably selected such that, in the case of a semiconductor material, it has an electron affinity equal to or larger than the electron affinity of the semiconductor substrate. Preferably, the substrate and the bottom layer are formed of the same semiconductor material. An example is a silicon bottom layer in combination with a silicon substrate.

The materials of the bottom layer and of the semiconductor substrate are preferably selected such that the barrier for injection of carriers from the bottom layer to the semiconductor substrate is equal to or lower than the barrier for injection of carriers from the semiconductor substrate to the bottom layer.

Preferably the bottom layer of the floating gate does not comprise Germanium.

The requirements for the work functions of, respectively, the control gate electrode material, the top and bottom layers of the floating gate electrode, and of the underlying substrate as listed in the paragraphs above can of course be combined in a more preferred embodiment.

Device Simulation and Results

In the following a simulation of a NAND cell as shown in FIG. 85 with a dual layer floating gate is discussed. The simulation shows that selecting an n-type material for the bottom layer and a p-type material for the top layer of the floating gate, as well as a p-type material for the control gate, effectively suppresses both program and erase saturation while maintaining program and erase efficiency.

The program and erase transients of various cell types are simulated using a 1-dimensional lumped model consisting of two components. The first component is the Metal-Oxide-Semiconductor (MOS) junction formed by the substrate, tunnel oxide and the bottom layer of the floating gate. The second component is the Metal-Insulator-Metal (MIM) junction formed by the top layer of the floating gate, the IPD and the control gate. The tunnel currents through the MOS and MIM junctions are calculated using the Wentzel-Kramers-Brillouin (WKB) approximation and the semi-classical expression for the impact frequency. For tunneling from the inversion layer in the substrate, the carrier concentrations and energy levels are determined using the triangular potential well approximation. The control gate and floating gate layers are assumed to be heavily doped, hence poly-depletion effects are neglected. The electric fields in the tunnel oxide and IPD are solved taking into account the CR, floating gate charge and the band bending in the MOS substrate. Program and erase transients are obtained by calculating the tunnel currents and adjusting the floating gate charge in a succession of time steps.

Figure 86:
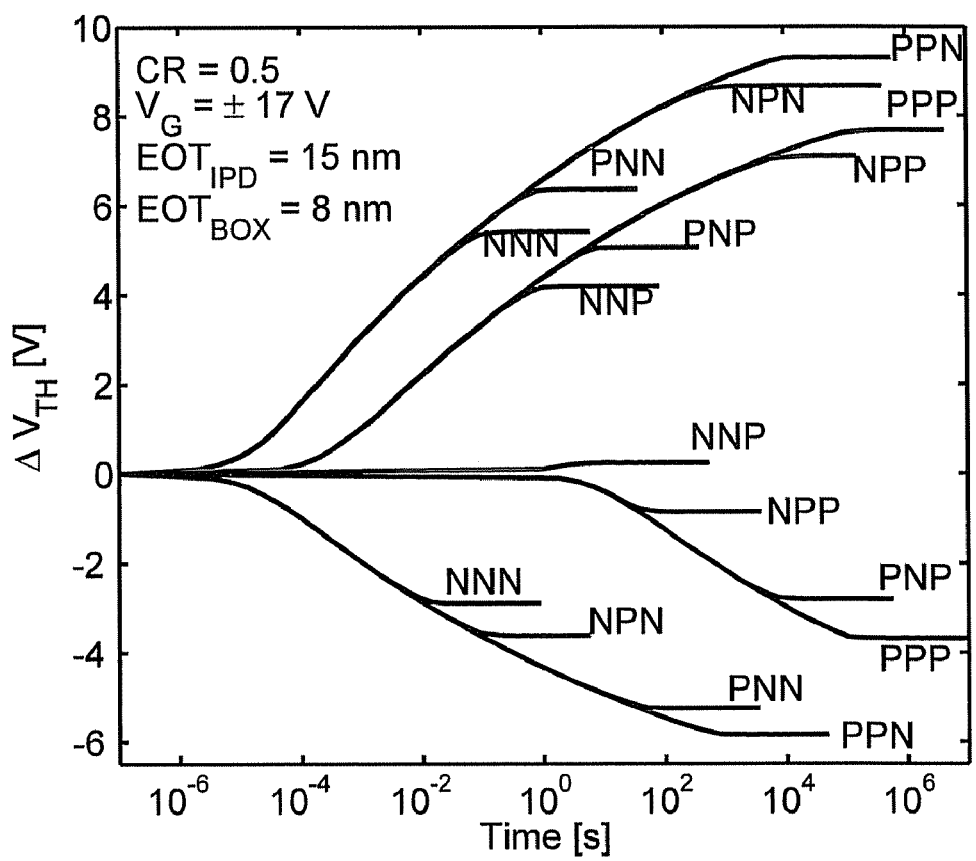
FIG. 86 shows the simulated shift in threshold voltage ($\Delta V_{th}[V]$) as function of time for programming (top part) or erasing (bottom part) for different work function combinations of control gate, floating gate top layer, and floating gate bottom layer for a p-type semiconductor substrate.

FIG. 86 shows the simulated shift in threshold voltage ($\Delta$Vth[V]) as function of time for programming (top part) or erasing (bottom part) for different work function combinations of control gate, floating gate top layer, and floating gate bottom layer for a p-type semiconductor substrate. Each of the erase/program simulation curves is done starting from a pristine device with no charge present in the floating gate. The coupling ratio was taken at 0.5 with an inter-poly-dielectric electrical equivalent thickness (EOT_IPD) of 15 nm and a tunnel dielectric electrical equivalent thickness (EOT_BOX) of 8 nm], the control gate electrode voltage for programming/erasing was set at +17V and −17V respectively. This 17V voltage is the external circuit bias applied to the memory cell which corresponds to the voltage difference between the control gate electrode and the substrate. In the case of a semiconductor control gate electrode and semiconductor substrate, this voltage difference corresponds to the difference in extrinsic Fermi-level between control gate electrode and substrate. The actual voltage distribution or electrical field distribution within the memory cell—in particular, over the inter-poly-dielectric and over the tunnel dielectric—depends on the thickness and composition of these dielectric layers, and on the work function of the control gate electrode, and of the top and bottom layer of the floating gate. In FIG. 86, only the work functions of the control gate electrode and of the floating gate top and bottom layer are varied. In FIG. 86, different work function combinations are identified by a 3 letter combination, whereby the first letter identifies the work function type of the control gate electrode, the second letter identifies the work function type of the top layer of the floating gate and the third letter identifies the work function type of the bottom layer of the floating gate. A NNN sequences thus refer to an n-type control gate electrode, an n-type floating gate top layer and an n-type floating gate bottom layer.

FIG. 86 thus shows the program and erase transients of various cell types. Indicated on the figure are the values of the CR, P/E voltages, tunnel oxide- and IPD EOT used for all cases. These values are chosen marginally different from contemporary ones to clearly demonstrate the concept. The transients start from the neutrally charged state until saturation is reached. The dual layer floating gate cell proposed here (PPN) clearly stands out as having the largest saturation level for both programming and erasing without compromising the program or erase efficiency. All cell types with p-doped bottom layer show deteriorated P/E efficiency and will not be discussed henceforth. Also the NPN case is of little interest as a viable alternative since it suffers from severe erase saturation.

The results of FIG. 86 can be explained by the following.

Programming

Compared to an n-type control gate electrode, a p-type control gate electrode will yield a higher threshold voltage shift, hence less program saturation, as shown when comparing NNN to PNN, NPN to PPN, NNP to PNP, and NPP to PPP. This reduction in program saturation is due to the smaller electrical field distribution over the inter-poly-dielectric for the same circuit bias as a result from the lower extrinsic Fermi-level of the p-type control gate electrode compared to the n-type control gate electrode. In the case of a p-type control gate electrode, during programming, the electrical field over the inter-poly-dielectric will be less and hence less injected carriers will flow through to the control gate electrode and less injected carriers will be lost for shifting the threshold voltage of the programmed memory cell.

Compared to an n-type floating gate top layer, a p-type floating gate top layer will yield a higher threshold voltage shift, hence less program saturation, as shown when comparing NNN to NPN, PNN to PPN, NNP to NPP, and PNP to PPP. This reduction in program saturation is due to the higher electron energy barrier towards the control gate electrode seen by electrons injected into the floating gate. As a p-type floating gate top layer has a lower extrinsic Fermi-level, and hence a lower work function compared to an n-type floating gate top layer, the electron energy barrier between the inter-poly-dielectric and the floating gate top layer will be larger for a p-type floating gate top layer.

Compared to an n-type floating gate bottom layer, a p-type floating gate bottom layer will yield a lower threshold voltage shift, hence more program saturation, as shown when comparing NNN to NNP, PNN to PNP, NPN to NPP, and PPN to PPP. This increase in program saturation is due to the smaller electrical field distribution over the tunnel dielectric for the same circuit bias resulting from the lower extrinsic Fermi-level of the p-type floating gate bottom layer compared to the n-type floating gate bottom layer. In the case of a p-type floating gate bottom layer, during programming, the electrical field over the tunnel dielectric will be less and hence fewer carriers will be injected into the floating gate from the substrate.

Erasing

Compared to an n-type control gate electrode, a p-type control gate electrode will yield a higher threshold voltage shift, and hence less erase saturation, as shown when comparing NNN to PNN, NPN to PPN, NNP to PNP, and NPP to PPP. This reduction in erase saturation is due to the higher electron energy barrier towards the floating gate seen by electrons injected from the control gate electrode. As a p-type control gate electrode has a lower extrinsic Fermi-level, and hence a lower work function compared to an n-type control gate electrode, the electron energy barrier between the inter-poly-dielectric and the control gate electrode will be larger for a p-type control gate electrode, and hence fewer carriers will be injected by the control gate electrode into the floating gate and will compensate for the erased floating gate charge during erase.

Compared to an n-type floating top layer, a p-type floating gate top layer will yield a higher threshold voltage shift, and hence less erase saturation, as shown when comparing NNN to NPN, PNN to PPN, NNP to NPP, and PNP to PPP. This reduction in erase saturation is due to the smaller electrical field distribution over the inter-poly-dielectric dielectric for the same circuit bias resulting from the lower extrinsic Fermi-level of the p-type floating gate top layer compared to the n-type floating gate top layer. In the case of a p-type floating gate top layer, during erasing, the electrical field over the inter-poly-dielectric dielectric will be less and hence fewer carriers will be injected into the floating gate from the control gate electrode.

Compared to an n-type floating gate bottom layer, a p-type floating gate bottom layer will yield a lower threshold voltage shift, and hence more erase saturation, as shown when comparing NNN to NNP, NPN to NPP, PNN to PNP, and PPN to PPP. This increased in erase saturation is due to the higher electron energy barrier towards the substrate seen by electrons injected into substrate. Because a p-type floating gate bottom layer has a lower extrinsic Fermi-level and hence a lower work function compared to an n-type floating gate bottom layer, the electron energy barrier between the tunnel dielectric and the floating gate bottom layer will be larger for a p-type top layer. Hence, fewer electrons can tunnel from the floating gate to the substrate.

Figure 87:
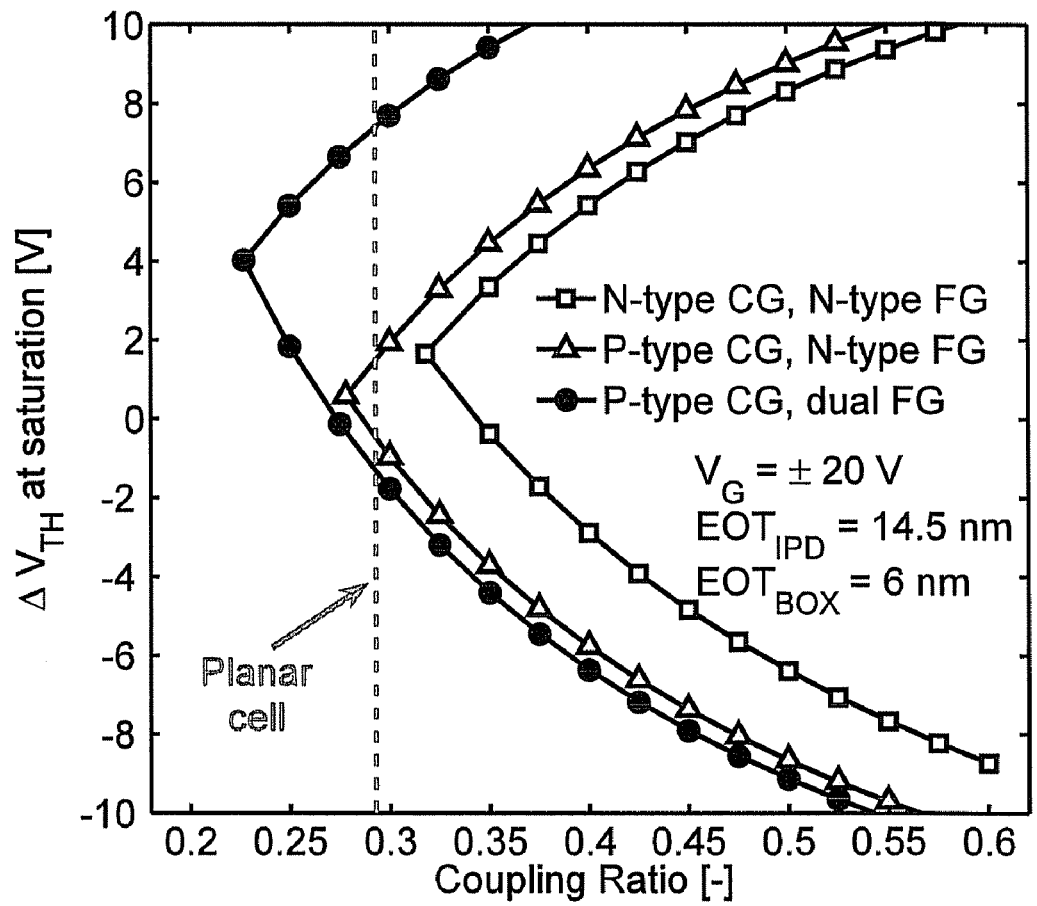
FIG. 87 shows a plot of the saturated P/E levels of different cell types plotted versus the coupling ratio.

To evaluate the scalability of the different cell types, the saturated P/E levels are plotted versus the CR in FIG. 87. The tunnel oxide- and IPD EOT are now set to the minimum still compatible with good retention. The dual layer floating gate cell clearly outperforms the other cell types. A planar cell with a CR of circa 0.29 still has a sufficient $\Delta V_{TH}$ window of circa 9V and satisfactory $\Delta V_{TH}$ for both programming and erasing. The conventional NAND flash cell and its p-type gate variant cannot be planarized as their $\Delta V_{TH}$ window is inadequate at low CR.

Figure 88:
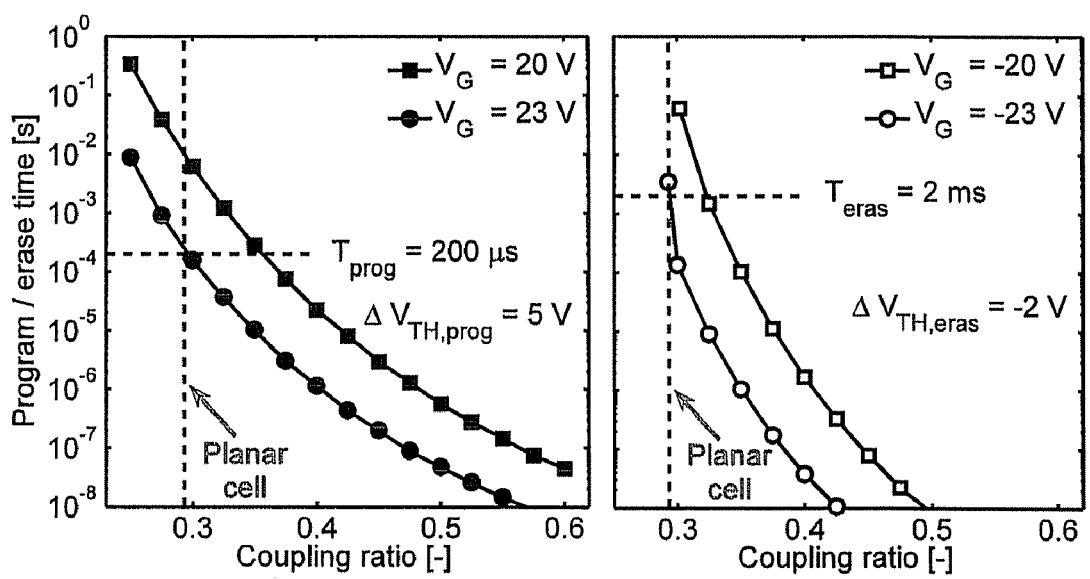
FIG. 88 shows plots of P/E times versus coupling ratio with optimization.

Besides reducing the $\Delta V_{TH}$ window, reduction of the CR inevitably leads to erosion of the P/E times. In FIG. 88 we demonstrate this can be compensated by an increase of the P/E voltages. When P/E voltages of ±23V are used, typical specifications for programming (FIG. 88 left) and erasing (FIG. 88 right) are reached.

In our simulations a pure silicon dioxide is used for modeling the IPD as an approximation to the conventional Oxide-Nitride-Oxide dielectric. One can envisage the use of a high-K dielectric to bring down the P/E voltages, which might be necessary for deeply scaled devices to avoid dielectric breakdown between the bit lines during programming. The highly doped regions in the floating gate form a backward diode with high reverse bias current, suppressing polarization of the floating gate. Alternatively, metallic materials can be considered to replace either or both of the floating gate layers. The work function of the selected metals then offers another degree of freedom to optimize the cell performance.

The above demonstrates the feasibility of scaling down floating gate NAND flash technology beyond the 40 nm node by introducing the concept of a planar dual layer floating gate cell.

I claim:

1. Non-volatile memory device comprising at least one memory cell on a substrate in a semiconductor material, each memory cell comprising:
    a channel region in between two doped regions of said substrate;
    a floating gate above said channel region, said floating gate comprising at least two layers constructed in different conductive or semiconductive materials;
    a first dielectric separating the floating gate from the substrate, said first dielectric being constructed in one or more dielectric materials and having predetermined properties enabling charge transfer by tunnelling between the channel region and the floating gate upon programming and erasing the cell;
    a control gate above said floating gate, said control gate being constructed in one or more conductive or semiconductive materials;
    a second dielectric separating the control gate from the floating gate, said second dielectric being constructed in one or more dielectric materials and having predetermined properties for suppressing charge transfer between the floating gate and the control gate;
    a first interface being defined as the contact surface between the channel region and the first dielectric;
    a second interface being defined as the contact surface between the first dielectric and the floating gate;
    a third interface being defined as the contact surface between the floating gate and the second dielectric;
    a fourth interface being defined as the contact surface between the second dielectric and the control gate;
    wherein at least two of the layers of the floating gate are separated by an intermediate dielectric layer having a predetermined thickness enabling direct tunnelling current between the layers; and
    wherein an overlap of the control and floating gates is larger than an overlap of the floating gate and the channel.

2. The non-volatile memory device of claim 1, wherein the intermediate layer has a thickness of 0.5 to 1.5 nm.

3. The non-volatile memory device of claim 1, wherein the semiconductor material of the substrate and the materials of the floating and control gates are chosen such that during programming the maximum electron affinity ($\chi_S$) along the first interface is by a first predetermined amount (D2) smaller than the minimum work function ($\phi_{FG,top}$) along the third interface and that during erasing the maximum work function ($\phi_{FG,bottom}$) at the second interface is by a second predetermined amount (D1) smaller than the minimum work function ($\phi_{CG}$) at the fourth interface, said first and second predetermined amounts (D1, D2) being chosen for suppressing charge transfer by tunnelling between the floating gate and the control gate relative to the charge transfer by tunneling between the floating gate and the substrate upon programming and erasing the cell.

4. The non-volatile memory device of claim 1, wherein the materials of the floating gate are chosen such that the minimum work function ($\phi_{FG,top}$) at the third interface is larger than the maximum work function ($\phi_{FG,bottom}$) at the second interface.

5. The non-volatile memory device of claim 4, wherein the floating gate comprises a first layer contacting the first dielectric and a second layer contacting the second dielectric, the material of the first layer being n-type semiconductor material and the material of the second layer being p-type semiconductor material.

6. The non-volatile memory device of claim 1, wherein the material of the floating gate at the second interface is a semiconductor material with a bandgap equal to or larger than the bandgap of the semiconductor substrate.

7. The non-volatile memory device of claim 1, wherein the material of the floating gate at the second interface is a semiconductor material with an electron affinity equal to or larger than the electron affinity of the semiconductor substrate.

8. The non-volatile memory device of claim 1, wherein the floating gate comprises a first layer contacting the first dielectric and a second contacting the second dielectric, and wherein the material of the floating gate at the second interface and material of the semiconductor substrate are selected such that the barrier for injection of carriers from the first layer to the semiconductor substrate is equal to or lower than the barrier for injection of carriers from the semiconductor substrate to the first layer.

9. The non-volatile memory device according to claim 8, wherein the material of the floating gate at the second interface is the semiconductor material of the substrate.

10. The non-volatile memory device of claim 1, wherein the material of the control gate at the fourth interface is p-type semiconductor material.

11. The non-volatile memory device of claim 1, wherein the third interface has a larger area than the second interface.

12. The non-volatile memory device of claim 11, wherein the floating gate is T-shaped.

13. The non-volatile memory device of claim 1, wherein at least one of said dielectrics comprises a stack of different dielectric materials.

* * * * *